(12) United States Patent
Best et al.

(10) Patent No.: US 9,704,576 B2
(45) Date of Patent: Jul. 11, 2017

(54) COMPLEMENTARY RRAM APPLICATIONS FOR LOGIC AND TERNARY CONTENT ADDRESSABLE MEMORY (TCAM)

(71) Applicant: Rambus Inc., Sunnyvale, CA (US)

(72) Inventors: Scott C. Best, Palo Alto, CA (US); Brent Steven Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/621,171

(22) Filed: Feb. 12, 2015

(65) Prior Publication Data

US 2015/0248936 A1    Sep. 3, 2015

Related U.S. Application Data

(60) Provisional application No. 61/945,969, filed on Feb. 28, 2014.

(51) Int. Cl.
*G11C 15/04* (2006.01)
*G11C 13/00* (2006.01)

(52) U.S. Cl.
CPC ........ *G11C 15/046* (2013.01); *G11C 13/0002* (2013.01)

(58) Field of Classification Search
CPC .................. G11C 15/046; G11C 13/0002
See application file for complete search history.

(56) References Cited

U.S. PATENT DOCUMENTS

| 7,675,765 | B2 | 3/2010 | Derharcobian et al. |
| 8,023,299 | B1* | 9/2011 | Gharia .................... G11C 11/16 365/49.1 |
| 8,320,148 | B1 | 11/2012 | Derhacobian |
| 2007/0097740 | A1* | 5/2007 | Derhacobian ....... G11C 11/5678 365/163 |
| 2007/0164781 | A1* | 7/2007 | Bangert ................. H03K 17/80 326/38 |
| 2010/0019830 | A1* | 1/2010 | Bangert ............ H03K 19/1736 327/478 |
| 2011/0002151 | A1* | 1/2011 | Javerliac ................. G11C 11/16 365/50 |

OTHER PUBLICATIONS

Guo et al., "A Resistive TCAM Accelerator for Data-Intensive Computing," MICRO'11 Dec. 3-7, 2011, Porto Alegre, Brazil. 12 pages.

* cited by examiner

*Primary Examiner* — J. H. Hur
(74) *Attorney, Agent, or Firm* — Lowenstein Sandler LLP

(57) ABSTRACT

A ternary content addressable memory (TCAM) cell may include a first resistive memory element, a second resistive memory element, a third resistive memory element, and a first switching element. The first resistive memory element may be disposed between a true data bit line node and a common node. The second resistive memory element may be disposed between a complement data bit line node and the common node. The third resistive element may be coupled to the common node and a word line node. The first switching element may have a control terminal coupled to the common node.

12 Claims, 17 Drawing Sheets

Data storage

| store | R1 | R2 | R3 |
|---|---|---|---|
| 0 | L | H | H |
| 1 | H | L | H |
| X | H | H | L |

| Verify Data Store | Bit Line Voltage | |
|---|---|---|
| | bn | bnB |
| 0 | VL | VH |
| 1 | VH | VL |
| X | VH | VH |

STEP 1

STEP 2

STEP 3

STEP 4

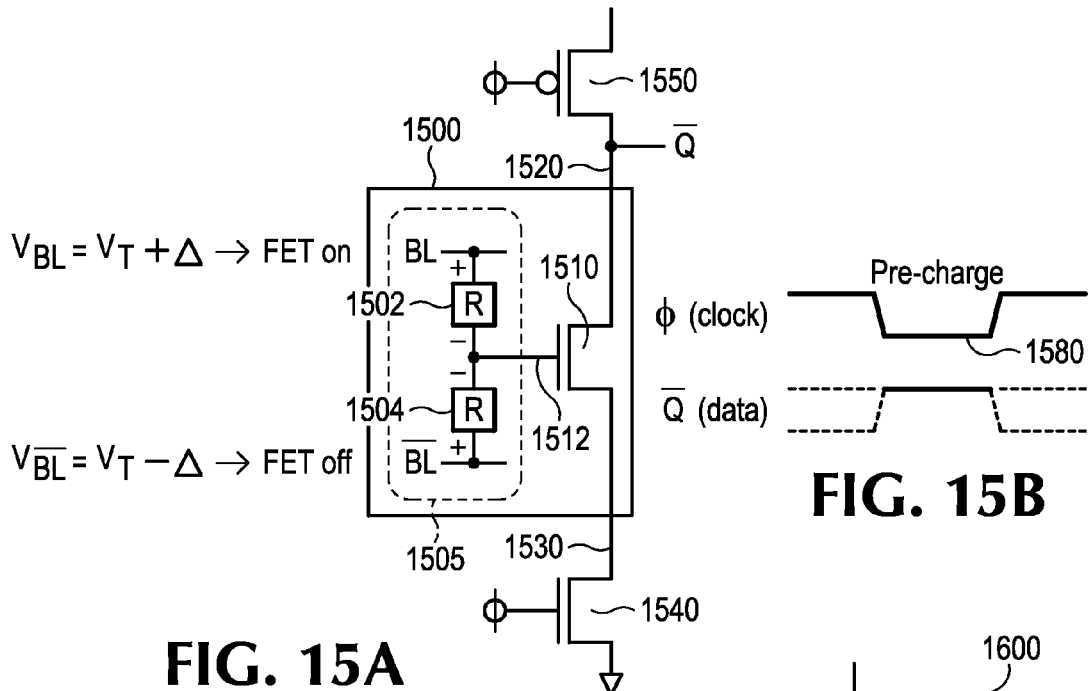
FIG. 15A
FIG. 15B
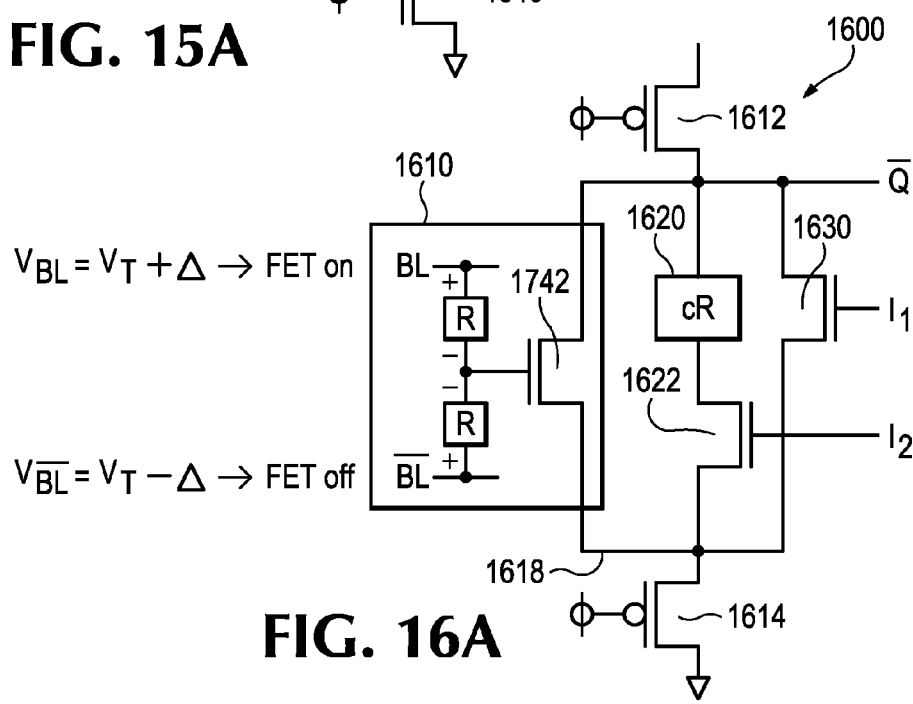
FIG. 16A
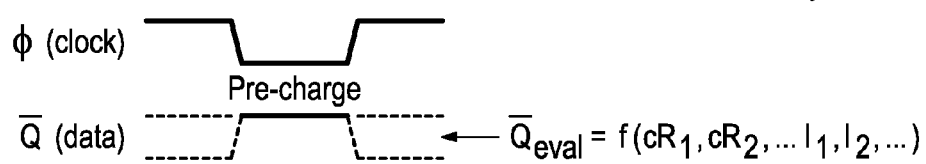
FIG. 16B

$V_{BL} = V_T + \Delta \rightarrow$ FET on
$V_{\overline{BL}} = V_T - \Delta \rightarrow$ FET off

COMPLEMENTARY RRAM APPLICATIONS FOR LOGIC AND TERNARY CONTENT ADDRESSABLE MEMORY (TCAM)

RELATED APPLICATION

This is a nonprovisional of U.S. Provisional Application No. 61/945,969 filed Feb. 28, 2014, incorporated herein by this reference.

TECHNICAL FIELD

We disclose resistive memory applications for logic circuits and ternary content addressable memory (TCAM).

BACKGROUND OF THE INVENTION

Unlike a block of Random Access Memory (RAM), which in response to a typical read command returns data stored at a specific address, a block of Content-Addressable Memory (CAM) responds instead to a match command to return the address of the memory location which stores the specific matched data word. This functionality is very useful for some applications, such as high-speed on-chip searching.

A Ternary CAM (TCAM) is a special type of CAM in which "wildcards" or "don't cares" can be stored along with the data. Hence there are three logical states (0, 1 and "X") and hence the ternary nomenclature. This functionality is suitable for many CAM applications where decisions are applicable to a broad range of data.

BRIEF DESCRIPTION OF THE DRAWINGS

FIG. 15A is a circuit diagram of a resistive memory element with clocked pre-charge devices arranged for level shifting an output of the memory element consistent with the present disclosure.

FIG. 15B is a timing diagram illustrating a pre-charge operation in the circuit of FIG. 15A.

FIG. 16A shows an example of a dynamic re-configurable logic circuit consistent with the present disclosure.

FIG. 16B is a timing diagram illustrating a pre-charge operation in the circuit of FIG. 16A preparatory to evaluation of a logic state of the circuit.

DETAILED DESCRIPTION

Figures 1A, 1B:
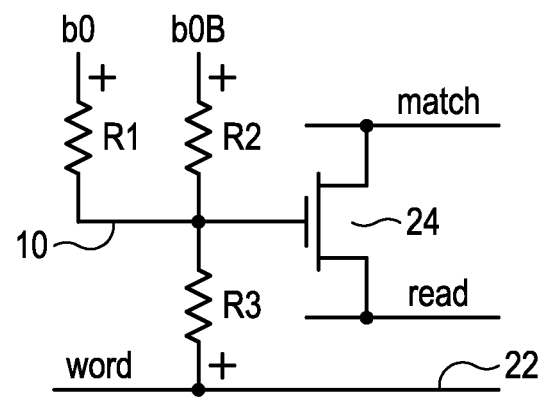
FIG. 1A is a circuit diagram of a TCAM memory cell according to an embodiment.
FIG. 1B is a data storage table showing an example of resistive memory element codings for a TCAM memory cell of the type illustrated by FIG. 1A.

Referring to FIG. 1A, a circuit diagram is shown of an illustrative embodiment of a 1T-3R TCAM memory cell which uses resistive memory to realize both the storage and comparison features, as further explained below. In FIG. 1A, the basic TCAM cell comprises three resistive memory elements labeled R1, R2 and R3. We will use these identifiers R1, R2 and R3 for resistive memory elements throughout this specification. The plus sign (+) adjacent one terminal of each resistive element implies the programming polarity for the set/reset operations (required of some but not all resistive memory types). For example, in this figure's embodiment, a resistor element transitions from HIGH-R to LOW-R when there is a sufficiently large positive program voltage across it, in accordance with the (+) sign, and it transitions from LOW-R to HIGH-R when there is a sufficiently large negative polarity presented.

The resistive elements are coupled, as shown, to a data bit line (D) and a complement data bit line (DB). In this illustration, a first resistive memory element, R1, is disposed between the true bit line and a common node labeled 10. The second resistive element R2 is disposed between the complement bit line DB and the common node 10. The third resistive element R3 is disposed between the common node and a word line 22. A switching element 24 may be implemented by a transistor. In this embodiment, this switching element 24 comprises a normal NFET transistor. The control terminal of switching element 24 (i.e., the gate of the NFET transistor) is coupled to the common node 10 so that the transistor is operable responsive to the states of the resistive memory elements.

In FIG. 1A, each of the resistive memory elements is selectively programmable to either a high resistance (HIGH-R) or a low resistance (LOW-R) state, as noted. In a preferred embodiment, a resistance of the HIGH-R state is equal to at least approximately three times the resistance of the LOW-R state. The memory cell of FIG. 1A is arranged to store a selected ternary state by programming a corresponding one of the resistive memory elements to the LOW-R state and programming the other two resistive memory elements to the HIGH-R state. Referring now to FIG. 1B, it shows an example of corresponding states of the three resistive elements of FIG. 1A for storing each of the ternary data states 0, 1 and "don't care" indicated by an X. So for example, the state "1" may be stored in the cell by programming R1 and R3 to the HIGH-R state, and R2 to the LOW-R state. The use of resistive memory elements may enable TCAM arrays with reduced area and lower power consumption.

Figure 2:
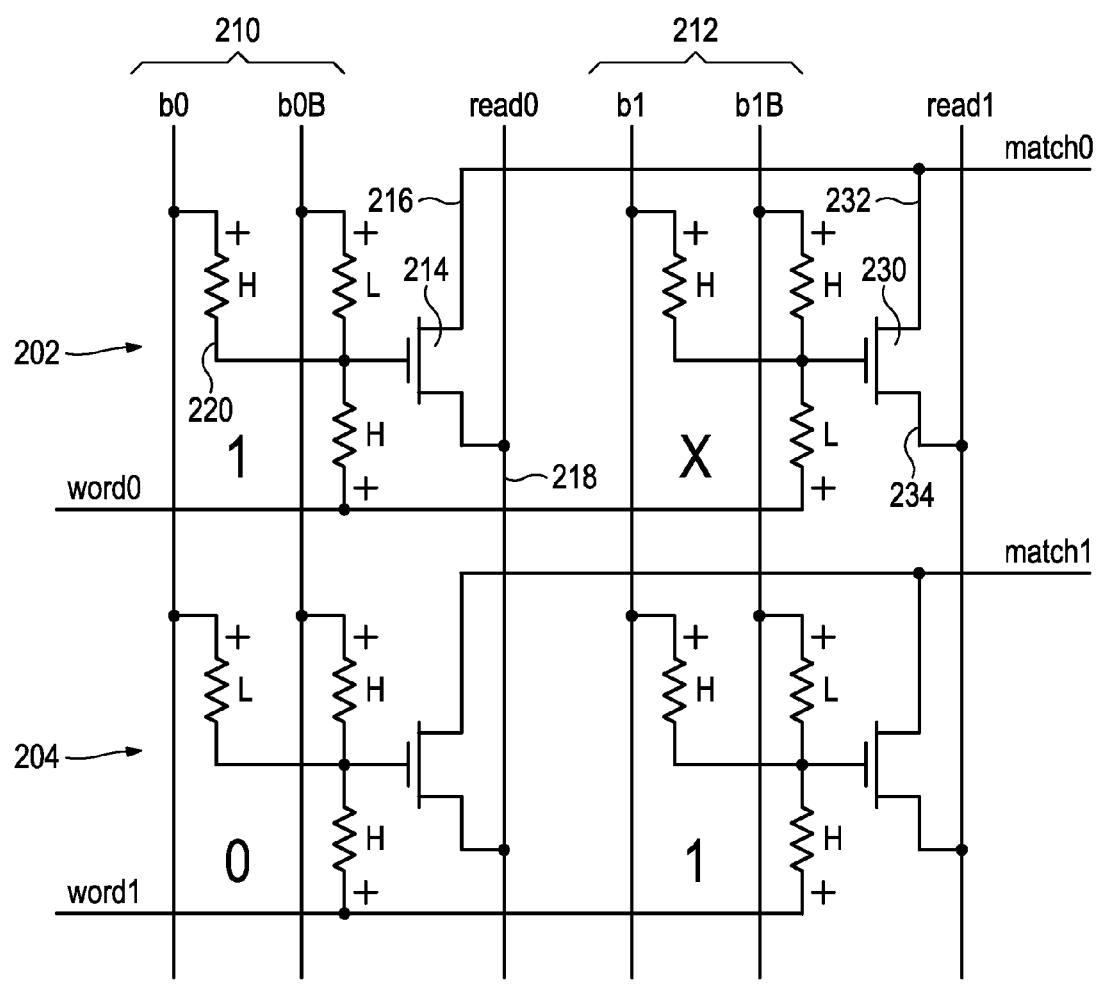
FIG. 2 is a circuit diagram of a 2×2 TCAM array according to an embodiment.

Referring now to FIG. 2, it illustrates the basic TCAM cell of FIG. 1A instantiated into a 2×2 array. Utilizing the ternary data storage scheme of FIG. 1B, the data word "1X" is stored in the first row 202, and the data word "01" is stored in the second row 204. In the array of FIG. 2, the first bit line b0 and its complement b0B are illustrated at 210. Similarly, for the next bit position, the bit line b1 and its complement b1B are indicated at 212. The bit lines and complement bit lines run vertically in this illustration to interconnect the corresponding bit cells in multiple rows of the array. The dimensions of the array, as in the other drawing figures, are merely for illustration and are not critical or limiting. Rather, a commercial memory device is likely to implement plural banks or arrays of memory, each comprising 64 or 128 bits, for example, and thousands of rows of memory cells.

Each cell in this embodiment includes one transistor operating as a switching element, as noted with regard to FIG. 1A. In FIG. 2, transistor 214 for example, has a gate terminal coupled to node 220. The NFET transistor 214 is the switching element for the cell at position bit0-word0 in the array. Transistor 214 has two non-control terminals (for example drain and source in the case of a FET). One of the non-control terminals, for example 216, is coupled to a match output node for word 0 ("match0"). The other non-control terminal 218 is coupled to a read output node for bit position 0 ("read0"). In the adjacent cell bit1-word0, the corresponding switching element 230 is again preferably a transistor, for example an NFET in one embodiment. The transistor 230 also has one of its non-control terminals 232 coupled to the match output node for word 0 ("match0"). And the other non-control terminal 234 is coupled to a read output node for this bit position 1 ("read1"). The next row 204 is similarly configured. Of course, the array can be extended both horizontally (more bit positions) and vertically (more rows) in like fashion, in which each additional bit position has corresponding true and complement data bit lines and a read output line. Each additional row of memory cells will include a corresponding word line and match output line.

Match Operations

Figure 3:
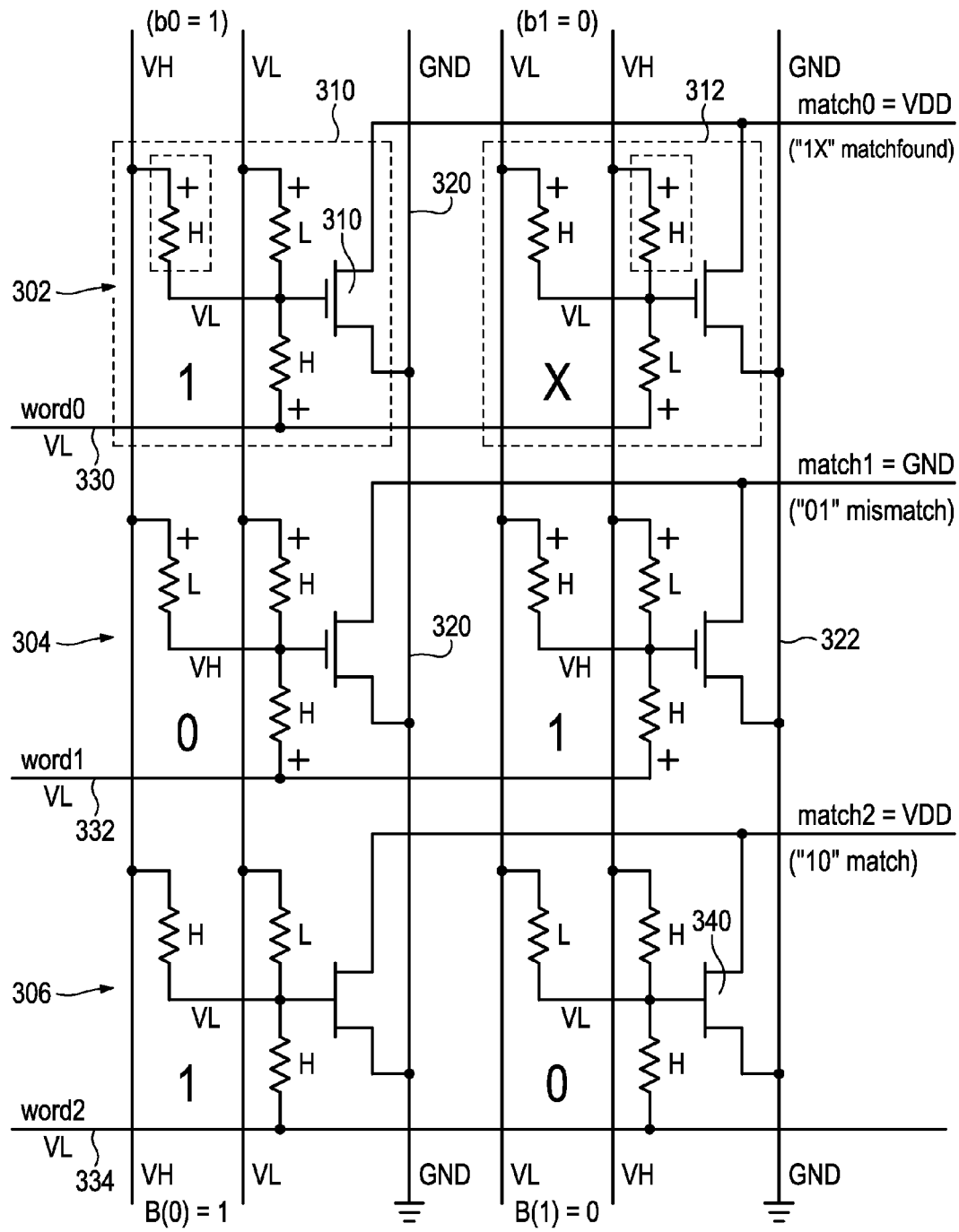
FIG. 3 is a circuit diagram illustrating operation of an embodiment of a TCAM array during a match operation.

FIG. 3 is a circuit diagram illustrating operation of a TCAM array of the type illustrated by FIG. 2 during a match operation. This illustration shows how the cell of FIG. 1A elegantly realizes both storage and comparison features with a single transistor. In FIG. 3, an array comprises three rows of TCAM cells. Data bits "1X" are stored in a first row 302. Data bits "01" are stored in a second row 304. And data bits "10" are stored in a third row 306. The stored data is reflected in the impedance states of the corresponding resistive elements, shown as H and L in the figure.

In an embodiment, active circuitry (not shown) provides a high voltage signal (VH) and a low voltage signal (VL) so as to apply a selected match bit pattern to the bit lines. The purpose is to identify any rows in the array in which the stored data matches the applied bit pattern. In the drawing, the applied voltages VH and VL are indicated on the adjacent bit lines. In this example, the applied match bit pattern is "10". This drives the "common node" of each cell (the transistor gate node) to the voltages indicated, responsive to the impedance states of the individual resistive memory elements. For example, in cell 310 (bit 0, row 302), the gate is driven to the low voltage VL. In the cell at bit 1, row 304, the gate node is driven to the high voltage VH. The read lines 320, 322 are biased substantially to ground. Note that we use the term "signal" in this application in the broad sense of an applied voltage and/or current, in the case of an input signal, which may be constant or vary over time. It may comprise, for example, an impulse, step function, periodic function, or any other waveform. In the case of sensing an output signal, the sensed quantity may comprise a voltage, a current, or a combination of the two. An output signal may be sensed at a given time, or over a given time period. It may be sensed relative to a clock signal. Transitions or waveforms may be detected, as well as constant values. Specific voltage and current values will vary depending on the particular resistive elements, implementation technology, circuit design, process, etc. Specific examples to follow are illustrative and not intended to be limiting.

During a match operation, the word lines 330, 332, 334 are driven to the low voltage VL, while the read lines are driven to ground. In some embodiments, prior to the match operation the three match lines match0, match1 and match2, corresponding to rows 302, 304 and 306, respectively, are pre-charged to a supply voltage VDD. In view of the respective gate voltages, as noted, the transistors in cells 310, 312 remain OFF, which is all of the transistors in the first row 302. Consequently, the first match line match0 will stay at VDD (where it was pre-charged) indicating that a match is detected. Note that in other match-sensing schemes (e.g., one which uses active pull-up circuits on the match line), pre-charging the match lines may not be necessary.

In the second row 304, both transistors have their gates pulled up to VH while their source terminal (connected to the read line) is at ground, which causes the transistor to conduct current, pulling the match line match1 down towards ground, indicating a mismatch for this row. In the third row 306, in contrast, both transistors have their gates driven to VL which is designed to be insufficient to cause the transistors to conduct current (i.e., the voltage differential between VL and the read line is configured to be smaller than the voltage threshold of the NFET transistor). Consequently, the output at match2 remains at VDD indicating a match. In general, in the match operation, in each active row, each mis-matched cell transistor will be turned on and thus pull the corresponding row match output node towards ground. The match outputs (match0, match1) in the circuit of FIG. 3 may be called "discrete match outputs," as distinguished from a "serial match chain end output node," described later.

Note that all of the resistive elements see a voltage differential of "VH-VL" during a match operation Depending on the polarity and magnitude of this voltage differential, this condition may contribute in some embodiments to a "read disturb," in which the resistance of the Hi-R state element is gradually reduced, because this bias is in the same direction as setting the cell to a Lo-R state. It is therefore preferred to select the applied voltages so that "VH" reliably turns on the cell transistor (e.g. NFET) and "VL" reliably does not. Further, the voltage "VH-VL" should be selected to not aggravate "read disturb." In addition to being chosen in consideration of the resistive memory, VH and VL can be chosen in consideration of the voltage driven at the read line during a match operation, as well as in consideration of the bitcell transistor (including but not limited to its threshold voltage, polarity (NFET or PFET), type (depletion mode or enhancement mode) and electrical tolerance). Therefore the specific VH and VL voltages will vary, depending on the particular resistive elements, transistor elements, implementation technology, circuit design, process, etc.

In an embodiment, a matching operation in a TCAM array thus may be summarized as follows: optionally precharging all of the match lines to a predetermined supply voltage; driving a match bit pattern on to the bit lines and the complementary bit lines of the array; biasing the read nodes of the memory cells substantially to ground; biasing each of the word lines to a low voltage VL; and sensing a state of at least one of the match lines for determining a match or mismatch of the corresponding row data relative to the match bit pattern. Sensing the state of a match line may include sensing a voltage transition of the match line from its precharged state. In an embodiment, a supply voltage VDD at the match line may indicate a match for the corresponding row. A transition to ground may be used to detect a mismatch.

In other embodiments, a lower power implementation may be realized by utilizing active pullup circuits on the match lines which limit the current flowing during a match operation, and thereby reduce overall power consumption. In such a design, a match/mismatch may be determined based on sensing the current flowing on the match line and determining whether the amount of current exceeded a particular reference level or not.

It may be further observed that during a match operation, the match line does not discharge through a resistive memory element. This may be advantageous at least because the match line response time is not a strong function of the actual resistance value of the resistive memory element, but rather just the ratio of the Hi-R to Lo-R impendences. Said another way, the amount of current flowing into the match lines during a match operation is substantially independent of the actual resistance of any memory element. That is, as long as the HI-R/LO-R states of the memory element are far apart (e.g., at least 3× different), the current flow primarily depends on the applied VH and VL voltages and the characteristics of the transistor element. This characteristic may simplify match detection, as in a preferred embodiment no reference resistors or match-current calibration steps are required. It will be shown below that similar advantages exist with regard to the read lines during a verify operation.

Verify Operations

FIG. 4 is a circuit diagram illustrating operation of an embodiment of a TCAM array 400 during a verify operation. The general arrangement of the array 400 may be the same as described above with regard to FIGS. 2 and 3 and therefore the detailed description will not be repeated. While a match operation returns a single comparison result for the entire word, a verify operation returns a bitwise result for every bit in a selected row. In this illustration, for a verify operation, the match line for the row being verified is held at ground, see node 404, while the match lines for the inactive rows, node 408 is an example, are pre-charged to a suitable voltage, e.g. VDD. In an embodiment this may be the same potential as that applied to pre-charge the read lines 410, 412 prior to data being driven onto the bit lines. Note that the verify operation takes advantage of the transistor's symmetric nature: in the match operation described earlier, the voltages applied to an "on" transistor caused it to conduct current from the match line into the read lines; during a verify operation, the transistor is biased "upside down" so that when it's turned "on", current will flow instead from the read lines into the match line.

Figures 4A, 4B:
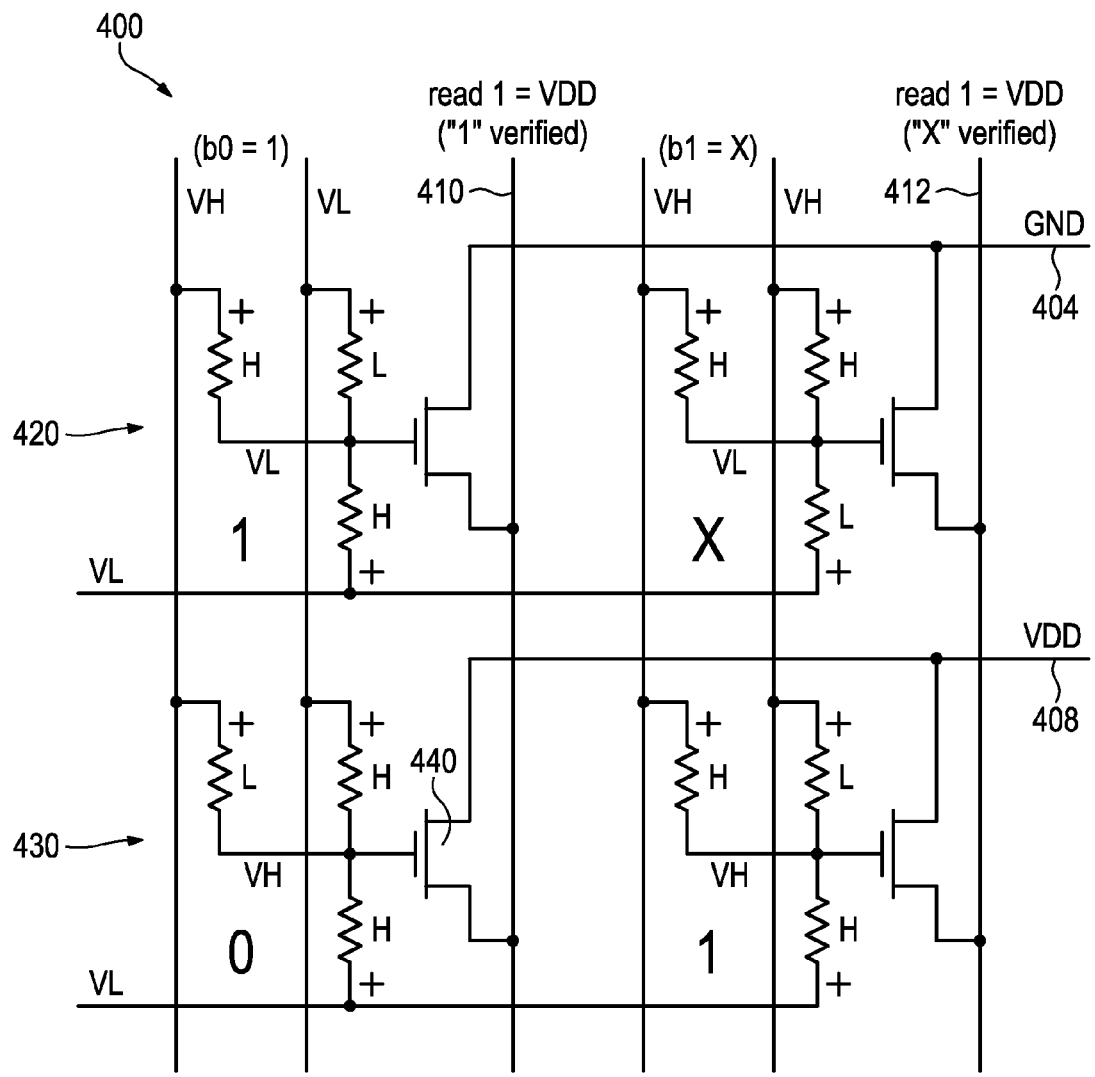
FIG. 4A is a circuit diagram illustrating operation of an embodiment of a TCAM array during a verify operation.
FIG. 4B is a table indicating voltage levels driven onto bit lines for verify operations in a TCAM array.

In this example, a "1X" data pattern is driven on the true and complement bit lines. This is the same as the data stored in row 420. In row 420, due to the properties of the L/H resistor dividers, both of the NFET's remain off, so all of the read lines remain at VDD, the voltage they were pre-charged to (i.e., verifying a bitwise match). Note that similar to the match operations described earlier, other current-sensing schemes are possible here, not all of which require precharging. If any of the bits were to mismatch, that bit's associated NFET would conduct current from its associated read line to the match line at GND. For example, if the second row 430 were being verified instead of the first, the bit 0 would mismatch, turning on transistor 440. Consequently, the read line 410 would be pulled low. Note that while the "sneak paths" via the inactive word lines may prevent mismatching read lines from fully transitioning to GND, the current flow into the read lines should be dramatically larger during a mismatch than a match, which should be more than sufficient to detect that a mismatch occurred. FIG. 4B is a table showing the voltages to be applied to the bit lines to verify each of the three data states.

Importantly, two sequential verify operations can be used to perform a whole-word read operation. Specifically, the bitwise result of verifying both an all-ones and all-zero input pattern can be logically combined to determine what bits are stored in each position, as follows: if a bit matches during the all-ones verify operation and not the all-zeroes verify operation, it's storing a 1; if a bit matches all-zeroes and not all-ones, it's storing a 0; and if a bit matches both all-ones and all-zeroes, it's storing an X ("don't care") value.

Figures 5A, 5B:
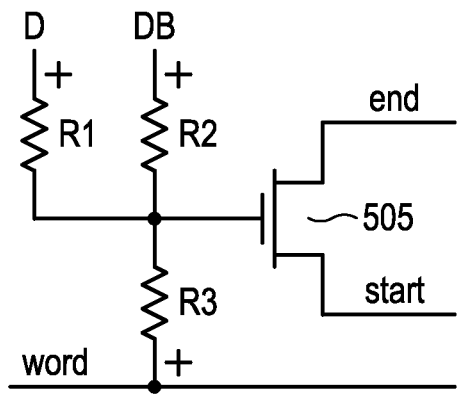
FIG. 5A is a circuit diagram of an example of a TCAM memory cell consistent with the present disclosure, identifying start and end nodes for a serial match string.
FIG. 5B is a data storage table showing another example of resistive memory element codings useful in a TCAM memory cell.

FIG. 5A is a circuit diagram of an example of a TCAM memory cell similar to the cell in FIG. 1A. In FIG. 1A, the schematic illustrates match and read line connections to the cell switching element, whereas in the cell of FIG. 5A, the non-control (non-gate) terminals of the switching element 505 are labeled "start" and "end," illustrating the connections to a "serial match string" arrangement in a TCAM array, described shortly. FIG. 5B shows an alternative example of resistive memory element ternary data storage coding for use in cells of the type shown in FIG. 5A to support serial string matching and verification, as explained below. Here, the codings for values 0 and 1 are reversed relative to the coding shown in FIG. 1B: a "0" value is stored with a LOW-R state for R2, while a "1" bit is stored by a LOW-R state for R1. The LOW-R state in R3 corresponds to the X state as before.

Figure 6A:
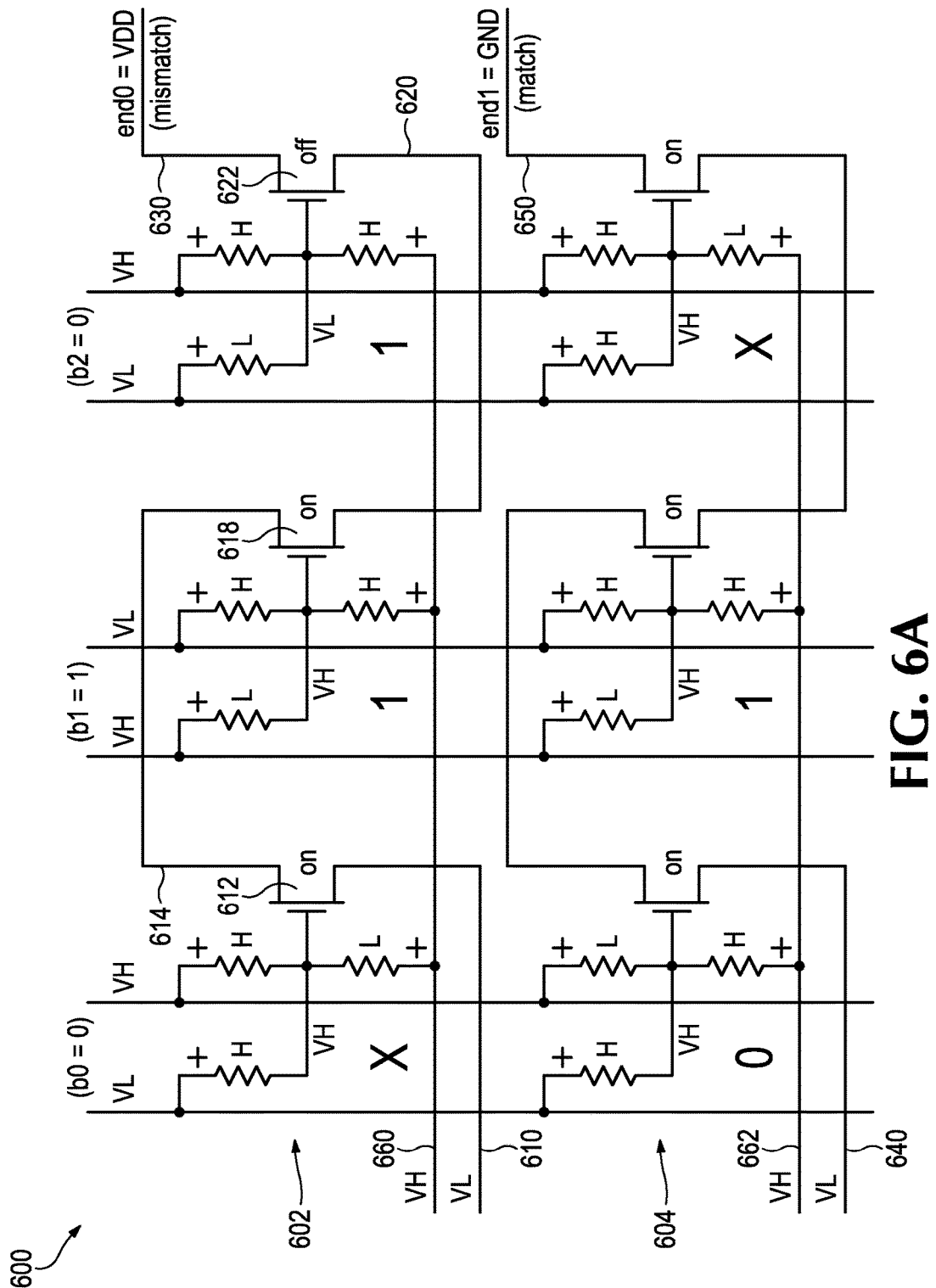
FIG. 6A is a circuit diagram of an example of a 3×2 TCAM array illustrating a serial match string feature.

FIG. 6A is a circuit diagram of an example of a 3×2 TCAM array 600 illustrating a representative memory array using a serial match string configuration. The dimensions of the array, as in the other drawing figures, are merely for illustration and are not critical or limiting. Rather, a realistic commercial memory device is more likely to implement 64 or 128 bits, and thousands of rows in one bank or array. The TCAM array 600 comprises rows and columns of TCAM memory cells similar to the resistive cells described above in FIG. 5A. For purposes of illustration, data bits "X11" are stored in the first row 602, using the coding of FIG. 5B. The corresponding impedance states of the individual resistive elements are indicated by the letters H and L, as before. Data bits "01X" are stored in row 604.

In row 602, a serial match string comprises a "start" node 610 coupled to a first terminal of the switching element 612 of the first bit position b0. A second conductive path 614 couples a second terminal of the switching element 612 to a first terminal of the switching element 618 of the next cell, bit position b1. A third conductive path 620 couples the second terminal of the switching element 618 to a first terminal of the switching element 622 of the next cell, bit position b2. Additional cells, if present, may be connected in like fashion. At the last cell, here bit position b2, a second terminal 630 of the switching element 622 is coupled to an end node 630. In this case, for row 0, the node is labeled "end0." Regarding the next row 604, a corresponding serial match string may be formed, beginning at node 640 and extending through subsequent cells to end at node 650, labeled "end1." Thus the serial match string, for a given row, extends through each of its cells, connecting the respective cell switching elements in series fashion. In an embodiment, the switching elements may be NFETs, or other transistor types as described earlier. In some embodiments, a serial match string may extend only to a subset of the bits of a row (e.g., a 128-bit row could be segmented into 8 strings, each 16 bits in length).

Referring again to the TCAM array 600, we next describe a match operation on the serial match string. Recall that data bits "X11" are stored in the first row 602. At the start of the match operation, the match outputs for each row of interest (here end0, end1) are pre-charged to a predetermined voltage, for example VDD (again, this example is assuming a pre-charge match sensing scheme; other sensing schemes as described earlier are readily achievable). The word lines (660, 662) are biased to VH as before, while an input bit pattern "010" is applied to the bit lines (where, as before, a logic "1" is encoded with VH on the true bit line and VL on the complement bit line, while a logic "0" is the logical inverse). Each cell operates generally as explained before. In row 602, the first cell b0 has a match (logic "0" matches X), and the VH voltage appears at the gate of the switching device 612, turning it "on". The next cell b1 also has a match, and transistor 618 is also turned on. Finally, however, b2 has a mismatch, and accordingly 622 is turned off. Consequently, because 622 is off, substantially no current flows in the row 602 serial match string, and thus substantially no current flows into the end0 node, so it remains substantially at the pre-charge voltage, VDD in this illustration. In row 604, all three bits match, and thus all three of the respective switching elements are turned on, pulling the output node "end1" toward ground, indicating a match.

In general, using this serial match string approach, substantially no current flows in the serial match string if any one of the bits mismatches. Note that in the earlier embodiment describe in reference to FIG. 3, current flowed in all mismatching rows. Since in a practical TCAM array, most rows will mismatch while only a few will match, the serial string approach offers significant power-savings advantages. Note that when the switching elements in all cells in the string are turned on (and the string conducts current between the "start" and "end" nodes) a match can be detected in various ways, including but not limited to the pre-charge method as just described. As noted above, it is preferred to select the applied voltages so that "VH" reliably turns on the string's switching elements (e.g. the NFET transistors) and "VL" reliably does not. Further, the voltage "VH-VL" should be selected to not aggravate "read disturb." Also as noted above, in addition to being chosen in consideration of the resistive memory, VH and VL can be chosen in consideration of the voltage driven at the read line during a match operation, as well as in consideration of the bitcell transistor.

In some embodiments, the amount of current that flows may be relatively small (depending on the size and number of serially connected NFET's), possibly reducing the maximum speed of operation compared to "wired-OR" approaches such as illustrated above in regards to FIG. 3. To mitigate this performance degradation, a 128-bit comparison, for example, could be broken up into eight 16-bit serial match strings, where the eight "end" results are subsequently logic-NOR'd together to determine a complete word match.

Figure 6B:
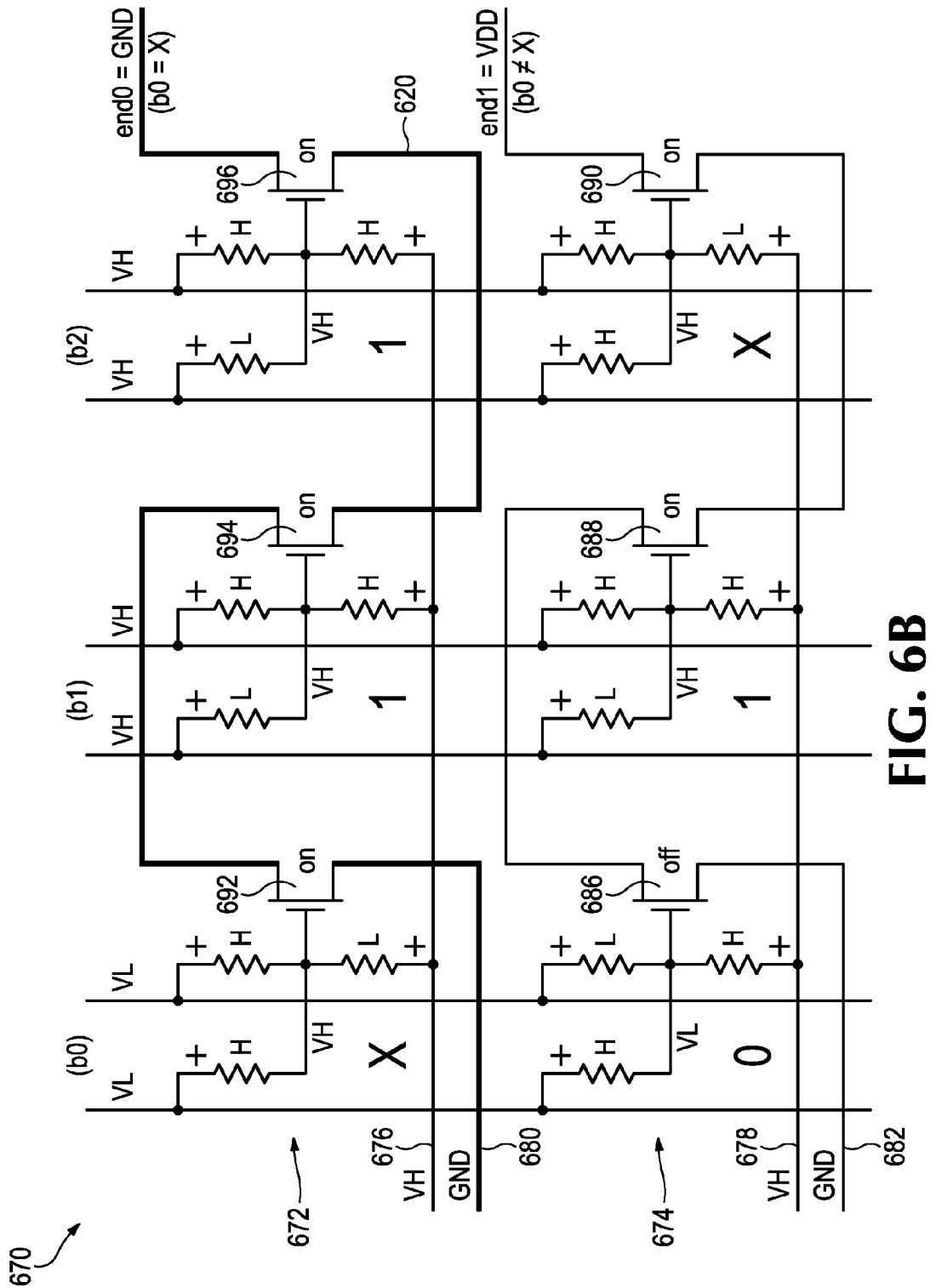
FIG. 6B is a circuit diagram of an example of a 3×2 TCAM array illustrating a serial match string feature.

FIG. 6B is a circuit diagram of another example of a 3×2 TCAM array 670 illustrating a verify operation on a serial match string configuration. In this example, the array 670 is arranged and operable in much the same way as the array 600 of FIG. 6A. Accordingly, detailed description of the memory cells, bit lines, word lines, etc will not be repeated here. As in the previous example, the memory cells are programmed to store the bit values "X11" in the first row 672 and the values "01X" in the second row 674. The values are merely illustrative.

As in FIG. 6A, the first row match string in FIG. 6B begins at node 680 and ends at output node "end0." The circuit path is highlighted by increased line width. Similarly, a second row 674 begins at node 682 and ends at output node "end1." As before, the serial match string extends from the start of each row, through each memory cell switching element in that row, to the end node, in serial fashion.

The primary differences in FIG. 6B relative to FIG. 6A are not in the array configuration or topology, but rather in the applied input signals and the sensed output signals. Indeed, these figures illustrate how, in some implementations, multiple different features or functions can be implemented in a single array (e.g., match, verify and read), simply by changing the input signals, and how we sense the outputs.

Referring again to FIG. 6B, a verify operation may be implemented as follows. A single selected bit position (column of cells) of the array 670, here bit b0 for example, has the bit lines driven to a selected test or verify value, in this case the "don't care" value "X," by driving both b0 and b0B to VL. This is the bit value to be verified. The other bit positions have both true and complement bit lines driven to VH, for reasons that will become apparent. The word lines for all words (rows) of interest, for example, word lines 676, 678 are all driven to VH. The selected bit position can be verified for one or more rows at substantially the same time as follows.

Because the bit lines and complement bit lines of all the non-selected (not under test) bit positions (here b1, b2) are driven to VH, all of the corresponding transistors will be turned on, so that current can flow through the corresponding portions of the serial match string path. The output node "end0" is pre-charged to VDD (again, assuming here again a pre-charged based sensing scheme). In the selected bit position of the array (again, b0 in this illustration), we first consider row 672. Because the value X "matches" the stored value in b0, and the word line is at VH, the transistor 692 is turned on. The other switching devices 694, 696 in the row 672 string are on as noted. Consequently, this string conducts current, pulling the output node "end0" toward ground, since the "start node" 680 is at ground. This state, sensed at "end0" may be interpreted as verifying the value stored in the selected bit position b0, namely "X."

In the second row 674, the first cell transistor 686 is turned off, due to the gate node connected through a LOW-R element to the complement bit line biased to VL. The other transistors 688, 690 in the corresponding verify string (starting at node 682) are both on as noted. Because transistor 686 is off, current does not flow in the verify string, and therefore the output at node "end1" remains substantially at VDD, which can be interpreted as "not verified"—i.e., the value stored in row 674, bit 0 is not the test value "X." In this way, every bit in the serial match string can be verified in turn. However, since only one bit in a row can be verified at a time, large rows could take substantial time to verify (e.g., 128 bit-verifies for a 128-bit row). So while the series match string has some significant power savings advantages during a match operation compared to the embodiment described earlier in regards to FIG. 3, its bitwise verify operation is substantially slower. This tradeoff is mitigated in the embodiments described below.

Figure 7:
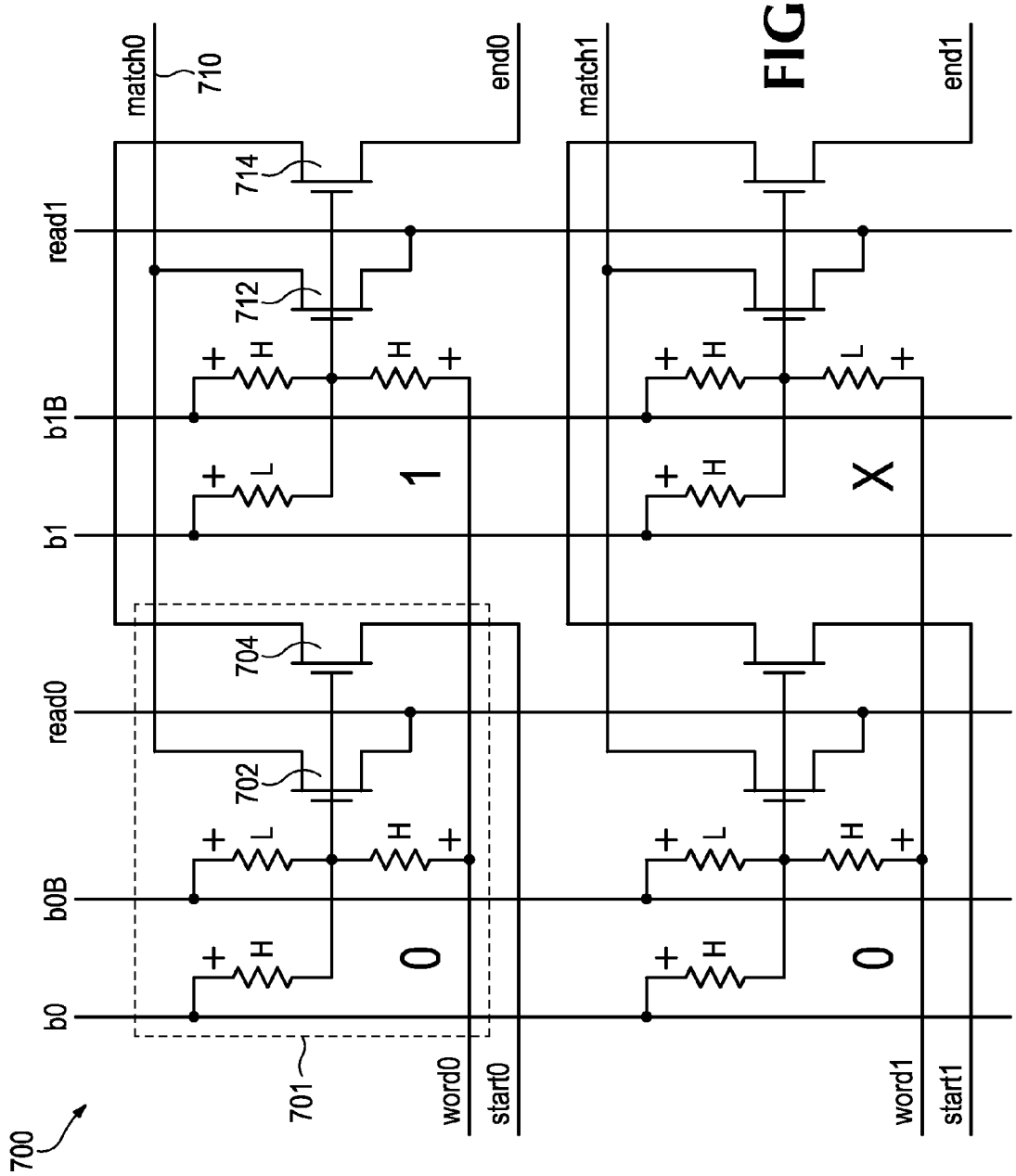
FIG. 7 is a circuit diagram of an example of a TCAM array employing 2T-3R resistive memory cells.

FIG. 7 is a circuit diagram of an example of a TCAM array 700 that employs 2T-3R resistive memory cells. In each cell, the three resistive elements are configured to store a ternary value per cell using the encoding of FIG. 5B. In this example, the array 700 may be arranged and generally operable in much the same way as the array 600 of FIG. 6A. Accordingly, detailed description of the memory cells, bit lines, word lines, etc will not be repeated here (they are labeled). In this illustration, the values "01" are stored in the first row, and "0X" are stored in the second row. In each memory cell, a first switching element is connected between a read line and a match line output (similar to the embodiments regarding FIG. 3), while a second switching element is connected between a start node and an end node (similar to the embodiments regarding FIG. 6A). Preferably, additional cells are connected in like fashion.

Referring again to FIG. 7, a fast match operation may be conducted for each row as described above with regard to FIG. 3, while a slower, lower-power match operation may be conducted for each row as described above with regard to FIG. 6A. Similarly, a fast verify operation may be conducted for each row as described above with regard to FIG. 3.

Figure 8:
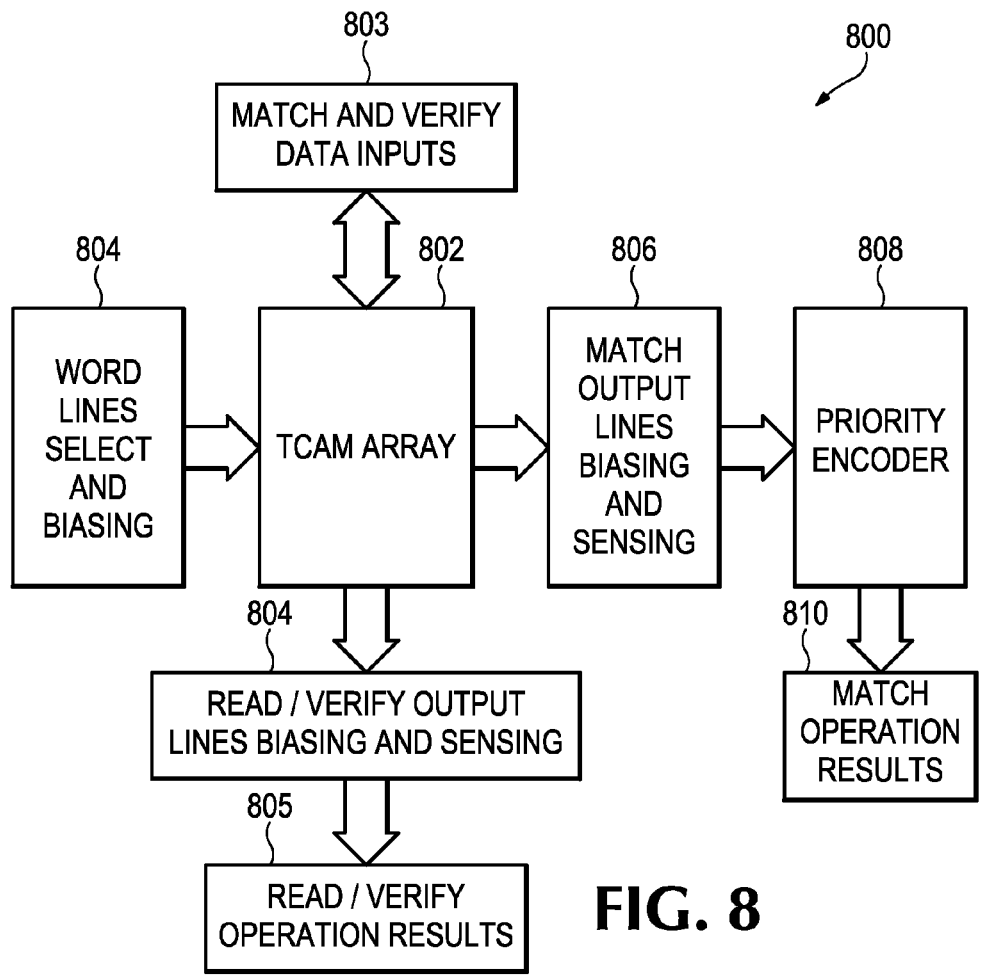
FIG. 8 a simplified block diagram illustrating an example of a TCAM memory system.

FIG. 8 is a simplified block diagram illustrating an example of a TCAM memory system 800. The system 800 includes at least one array 802 of TCAM memory cells. The individual cells (not shown) may comprise resistive memory cells generally of the types described above. Circuitry 804 may provide inputs to select or drive individual word lines of the array. Circuitry 804 may provide biasing of the word lines. In some embodiments the word lines may be controlled as discussed above for matching operations. Circuitry 803 also is coupled to the TCAM array 802 to provide data inputs for matching and or verify operations. In some embodiments matching input data may be applied to bit lines (not shown) as discussed above. In some embodiments, verify input data may be applied to bit lines as discussed above. Circuitry 806 may provide biasing and sensing of match output lines of the array. In some applications output data from circuitry 806 may be input to a priority encoder 808. A priority encoder is a circuit or algorithm that compresses multiple binary inputs into a smaller number of outputs, for example a 4-to-2 encoder. The encoder may generate match operation results 810. Circuitry 804 may provide biasing and sensing of read/verify output lines of the array 820. Circuitry 804 may provide read/verify results indicated at box 805.

Write Operations

Figure 9:
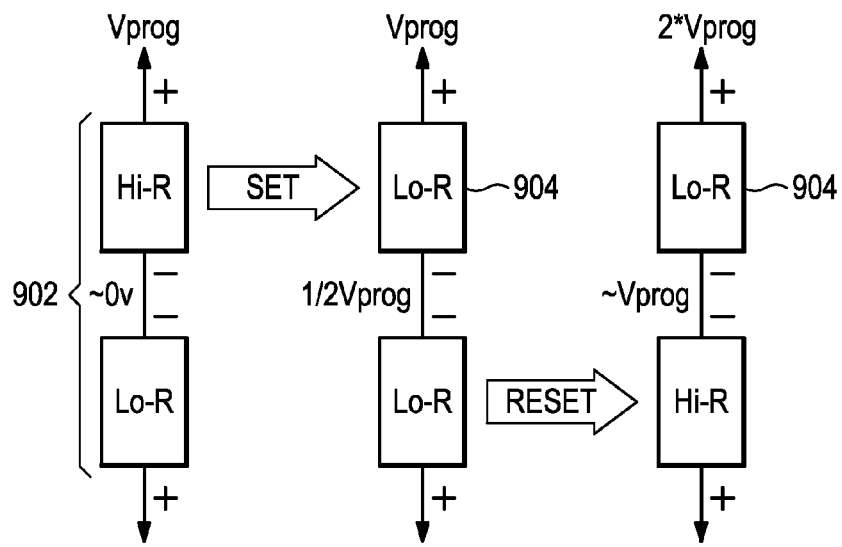
FIG. 9 is a simplified conceptual diagram illustrating two-step programming of complementary resistive memory elements.

Another operation for a memory cell is of course a write operation. In part because the most area-efficient memory cell contains no active devices to isolate the resistive memory elements during programming events, it is challenging to apply programming voltages that will not disturb (change the states of) neighboring devices. While more active devices could be added to mitigate this challenge, the following technique describes an approach that works without that additional overhead. In this technique, in general, every write operation consists of four steps: in steps one and two, every bit cell in the row is programmed to store the "X" state. In steps three and four, the desired pattern of ones and zeroes are programmed into their target bit cells. Four steps are necessary in this technique, as the series resistive element programming mechanism is inherently a two-step operation. Specifically, if two resistor memory elements are arranged in series such that their "programming polarities" are unaligned, then a large voltage across the two resistors will cause the two resistors to swap states (e.g., Lo-R/Hi-R to Hi-R/Lo-R), going thru an intermediate state (Lo-R/Lo-R) first, as illustrated in FIG. 9. Programming resistive memory is discussed in U.S. Provisional Application No. 61/794,872 filed Mar. 15, 2013 (Inventors Deepak Chandra Sekar, et al; ref. RA-1403).

Figure 10:
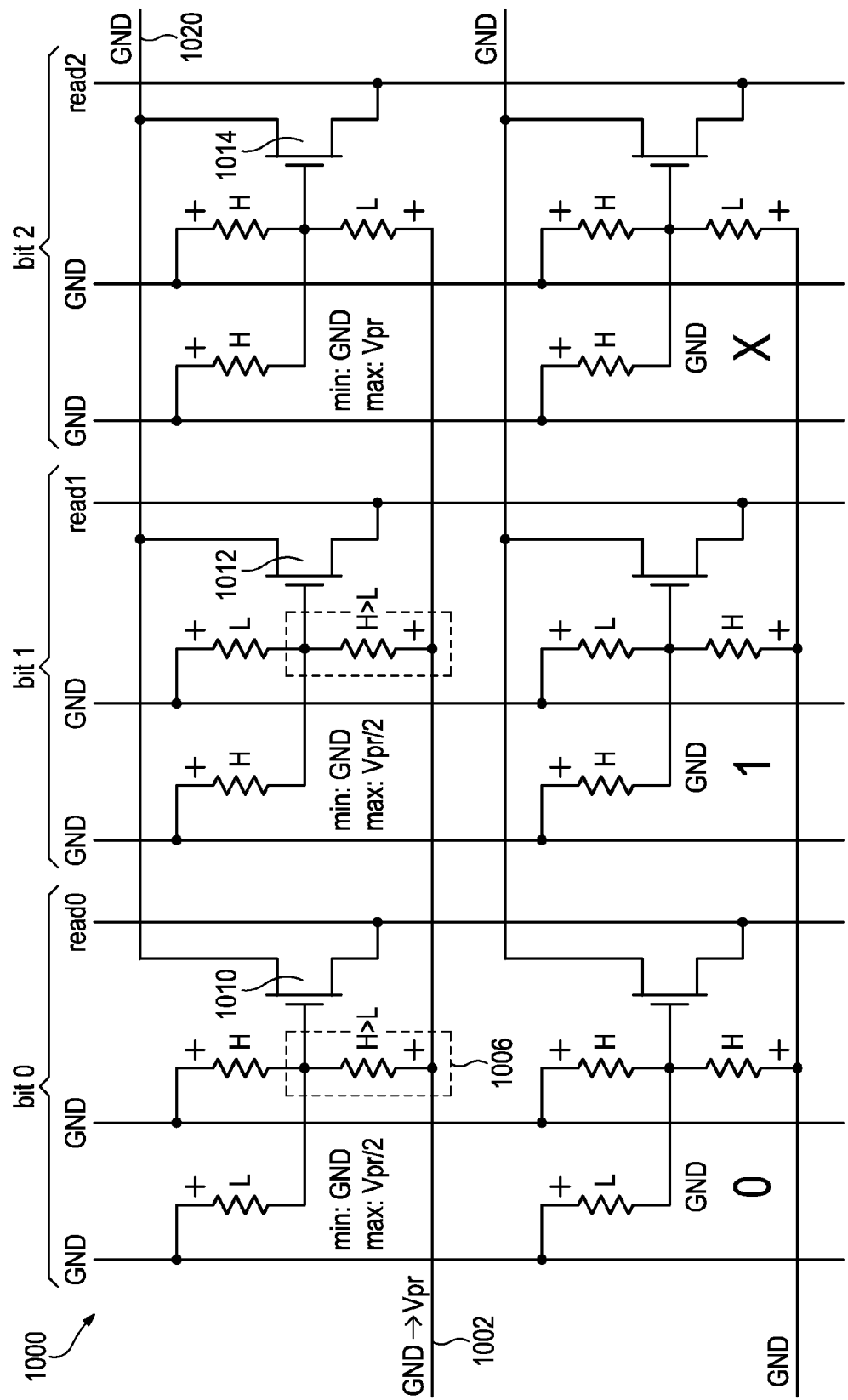
FIG. 10 is a circuit diagram illustrating operation of a TCAM array during a first step of a 4-step write operation consistent with the present disclosure.

FIG. 10 illustrates the functionality during the first phase of a 4-step write operation. Here, the array 1000 is 3×2 to better illustrate the write-disturb challenges. In the figure, the word line 1002 for the first row is raised to a programming voltage Vpr, while all of the other word lines are held at GND. This programming voltage Vpr appears as a large positive potential across the Hi-R resistor 1006, which causes it to flip from a Hi-R to a Lo-R state, resulting in the "Lo-R Lo-R" middle state shown in FIG. 9. The gate voltages at bit 0 and bit 1 cells transition from GND to approximately one-half the programming voltage (Vpr/2) when the resistor transitions state. In this FIG. 10 and in the following FIGS. 11-13, the gate voltage transitions are indicated with the starting voltage "min:" and the ending voltage "max:". For example, in bit 0 the gate voltage transitions from "min. GND" to "max: Vpr/2." As the gate voltage transitions when the Hi-R to Lo-R transition is complete, this voltage transition can be optionally sensed by the corresponding switching device, preferably an NFET device 1010, by proper biasing of the associated match line and the bit's read line. In this write-sensing option, the match line 1020 for the row is held at GND, which assumes that Vpr/2 is sufficient to cause the NFET transistors 1010, 1012, 1014 to start conducting current, detected at each bit's read line (in manners similar to verify operations described earlier). In other embodiments, the write operation can proceed without sensing the transition, and a normal verify operation (as described earlier) can be used to either confirm the write's completeness, or schedule it for a write retry.

Figure 11:
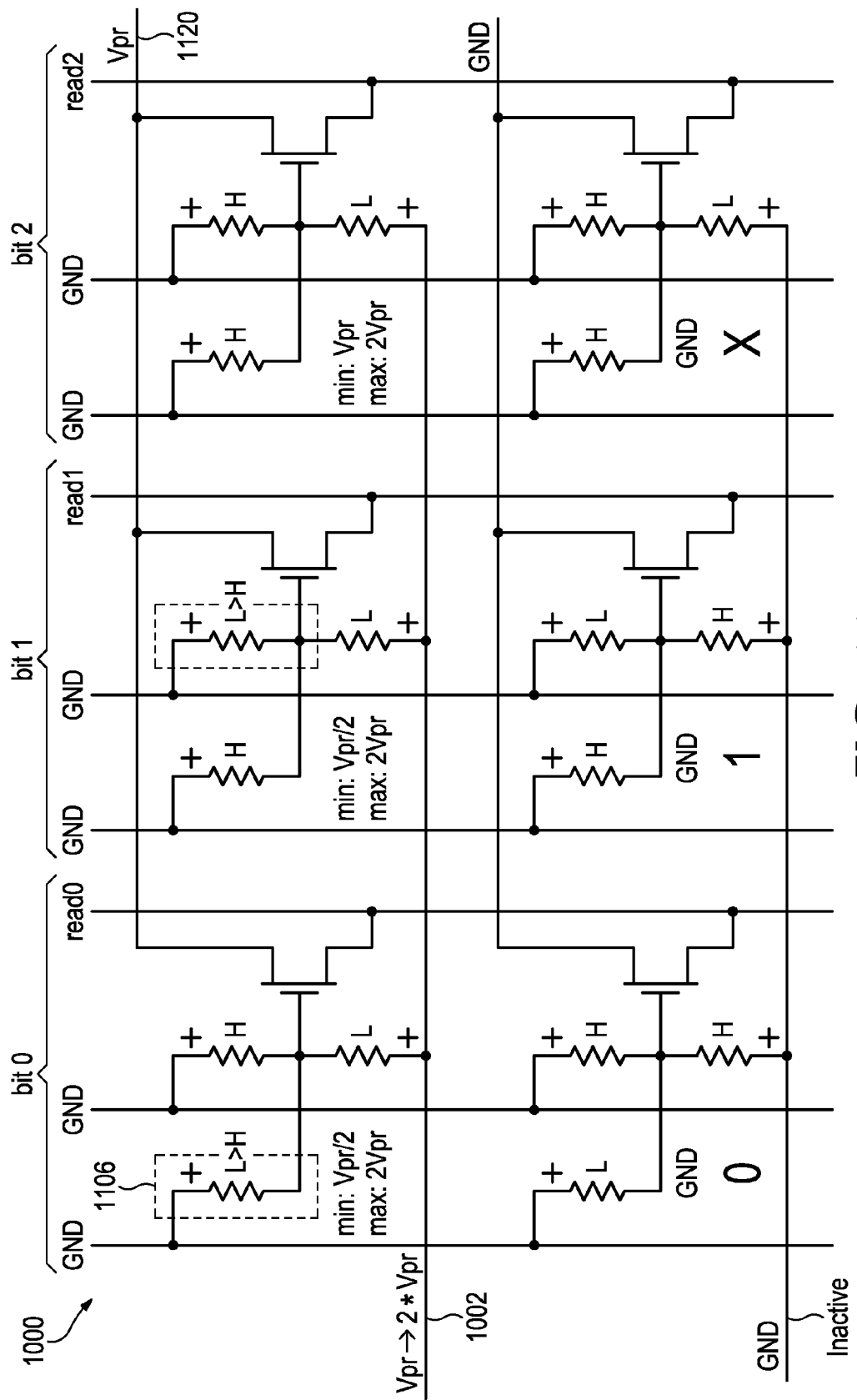
FIG. 11 is a circuit diagram illustrating operation of a TCAM array during a second step of a 4-step write operation consistent with the present disclosure.

After step #1 of the write programming is complete (i.e, all bit cells in the selected row now have a Lo-R resistor in the bottom resistor position), step #2 can begin, illustrated in FIG. 11, which depicts the same array 1000 as in FIG. 10 with the resistor values updated. In this step #2, the word line 1002 associated with the row being programmed has its programming voltage increased from Vpr (where it was for step #1) to 2*Vpr. As indicated in FIG. 9, this voltage preferably is substantially evenly split between the two Lo-R resistors (902) that are arranged with opposite programming polarities. Increasing this potential from Vpr to 2*Vpr will cause the top device (904 in FIG. 9; 1106 in FIG. 11) to flip from Lo-R to Hi-R, while not affecting the other Hi-R device in that bit cell at all (the Hi-R device being largely unaffected by a programming voltage of that polarity). The same Lo-R to High-R transition occurs for other bit cells in the row so that at the completion of step #2, all bit cells in the word are programmed to the "X" state (where only "R3" from FIG. 1A is low impedance), the default state from which other word values can be programmed.

Similar to step #1, the transition from Lo-R to Hi-R will cause a voltage transition at the gate of the corresponding selection device, which can again optionally be used to determine completion of this step of the write process. For example, in such a write-sense option, the match line 1120 for the word being programmed is held at Vpr, then the voltage transition (from Vpr to 2*Vpr) at the moment of resistor state transition can be sensed by the corresponding switching device, preferably an NFET, by proper biasing of that device's read line. Alternatively, as with write step #1, a program-then-verify approach could be utilized instead.

Figure 12:
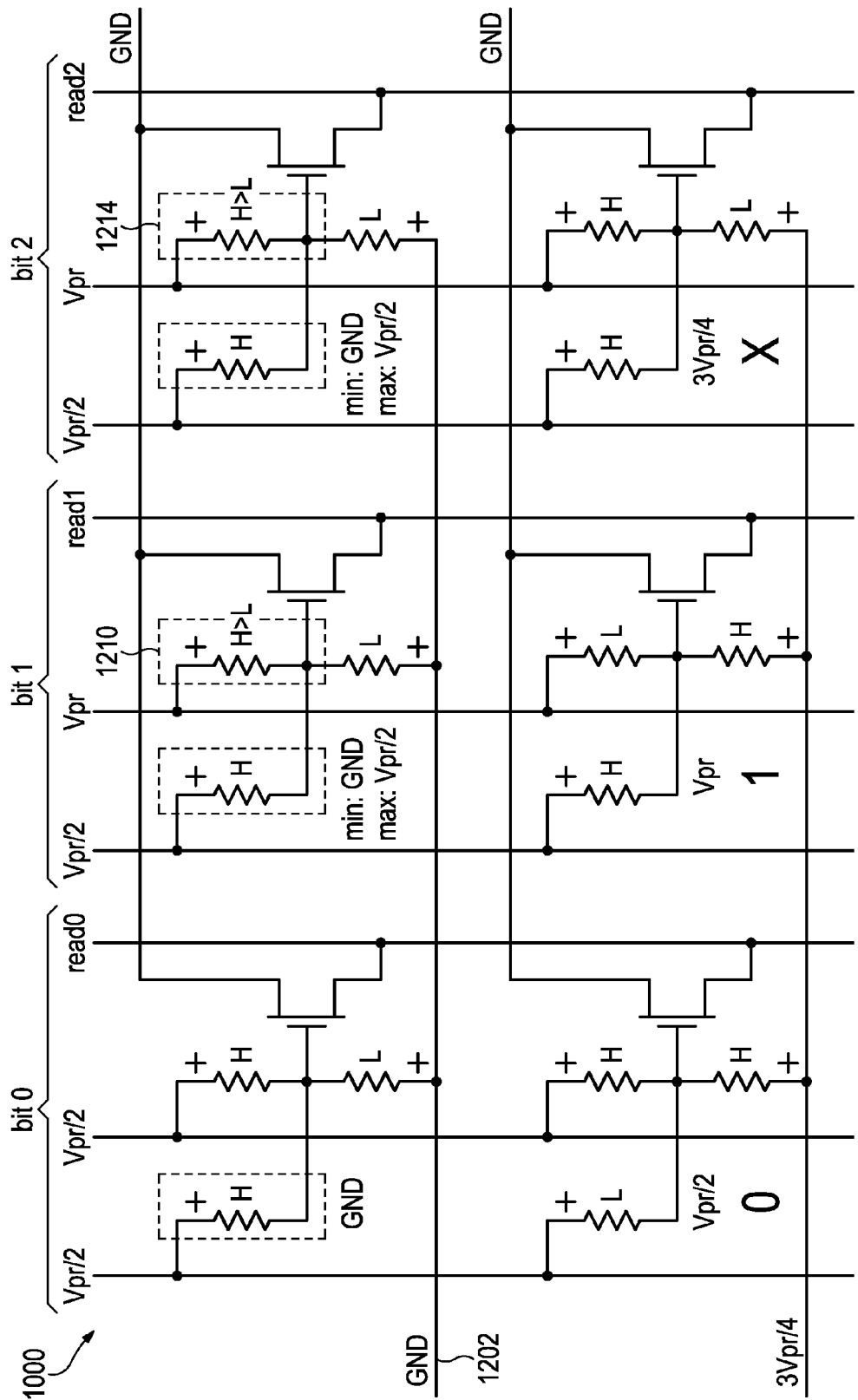
FIG. 12 is a circuit diagram illustrating operation of a TCAM array during a third step of a 4-step write operation consistent with the present disclosure.

FIG. 12 illustrates step #3 of a write operation in the array 1000. In this example, values "X11" will be programmed into the top row of the array. As in steps #1 and #2, a two-step process will be used where the "Lo-R/Lo-R" transition state of FIG. 9 will be utilized. In step #3, depending on the desired stored bit value of the memory cell, either a half or a full programming voltage is selectively applied across the bit lines relative to the active word line. In this example, to store an "X" in the bit 0, a Vpr/2 voltage is applied to bit line 0 and its complement. To store a "1" in bit 1, Vpr/2 is applied to the bit line, while Vpr is applied to the complement. And finally to store a "1" in bit 2, Vpr/2 is applied to the bit line, and Vpr is applied to the corresponding complement bit line, as indicated in the drawing. Note that as with steps #1 and #2, there is a voltage transition at the gate of the switching element (e.g., the NFET transistor), which can optionally be used in conjunction with appropriate read line and match line biasing to sense the completeness of this programming step.

Note that the top row word line 1202 is biased to ground during step #3, as this is the active row that we intend to program. As the bit lines are shared by inactive rows that are not isolated by active devices in this overall 4-step write technique, non-active word lines must be driven to an intermediate voltage, for example 3/4Vpr, to avoid write-disturb issues (i.e., we do not want to inadvertently change the state of any bit cells in the second row while we are programming bit cells in the first). For example, two resistive devices 1210, 1214 in FIG. 12 see a full programming voltage across them at this step, but none of the resistive elements in the second row see more than a quarter of the programming voltage (i.e., the inactive rows see a portion of the programming voltage ("Vpr-3/4Vpr") but it is not sufficient to cause a write-disturb condition).

Figure 13:
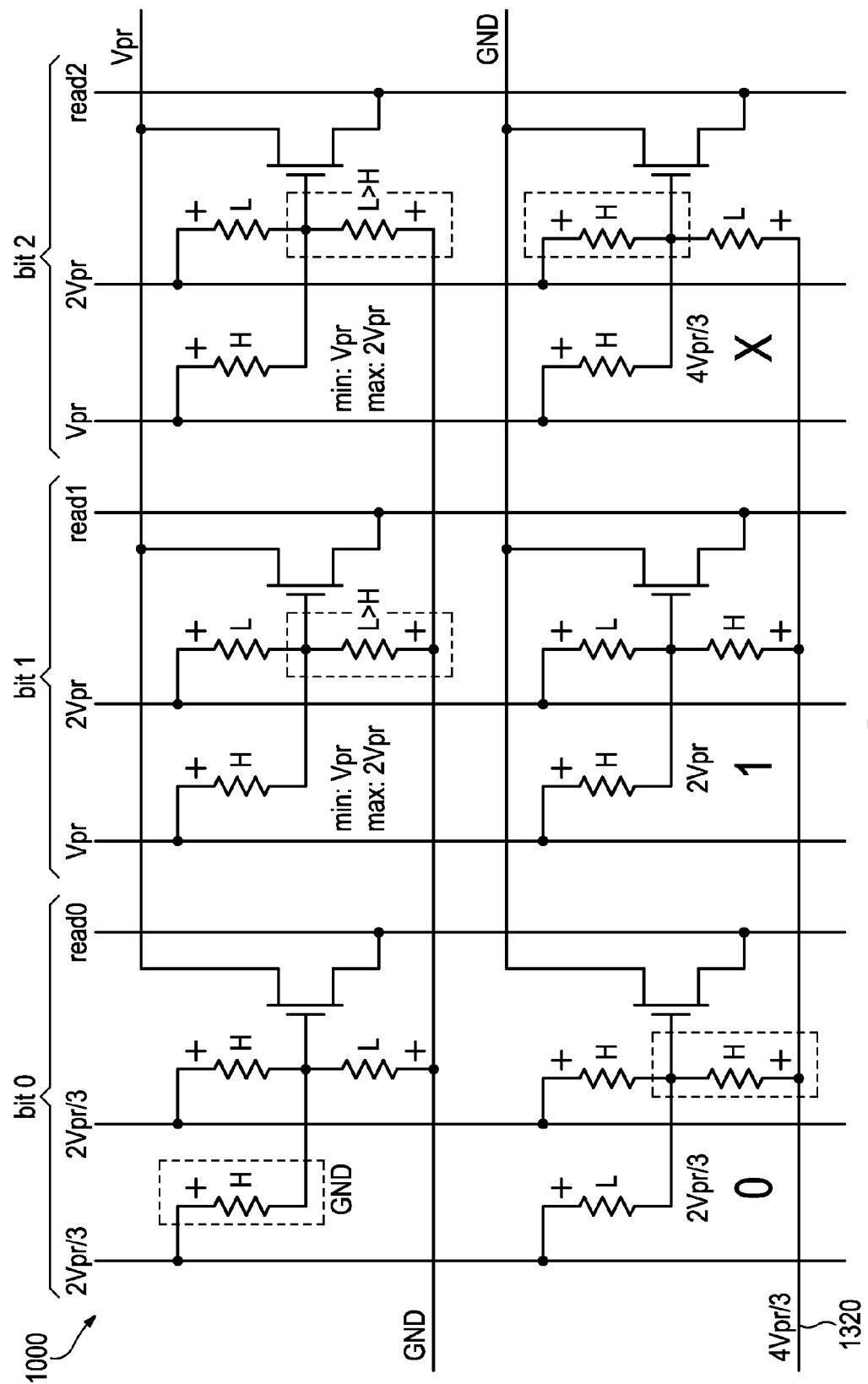
FIG. 13 is a circuit diagram illustrating operation of a TCAM array during the final step of a 4-step write operation consistent with the present disclosure.

FIG. 13 illustrates step #4 of the write operation. Recall in step #3, all bits in the active row began at the X state, and at the end of step #3, two resistive elements transitioned to Lo-R from Hi-R, forming the intermediate "Lo-R/Lo-R" state from FIG. 9. To complete the programming in step #4, the reader can observe the bit 1 line transition from Vpr/2 to Vpr, and the complement bit line transition from Vpr to 2Vpr. Under the applied conditions, the gate node of bit 1, row 0 transitions from Vpr to 2Vpr as indicated, causing R3 (from FIG. 1A) to switch from Lo-R to Hi-R. The same transition occurs in bit 2, and thus the value "X11" is programmed into the row. To avoid a write disturb condition during step #4, both the non-active bit lines and non-active words lines are driven to an intermediate voltage. In an embodiment, as illustrated, the bit lines may be driven to 2Vpr/3 while the word lines may be driven to 4Vpr/3. In this illustration, the specified biasing results in three devices seeing ⅔ of the programming voltage Vpr across them, which is not sufficient to cause a write disturb condition. Specific biasing and programming voltages may vary depending on the particular resistive elements employed, implementation technology, circuit design, process, etc. Note that as with steps #1, #2 and #3, there is a voltage transition at the gate of the switching element (e.g., the NFET transistor), which can optionally be used in conjunction with appropriate read line and match biasing to sense the completeness of this programming step.

Figure 14A:
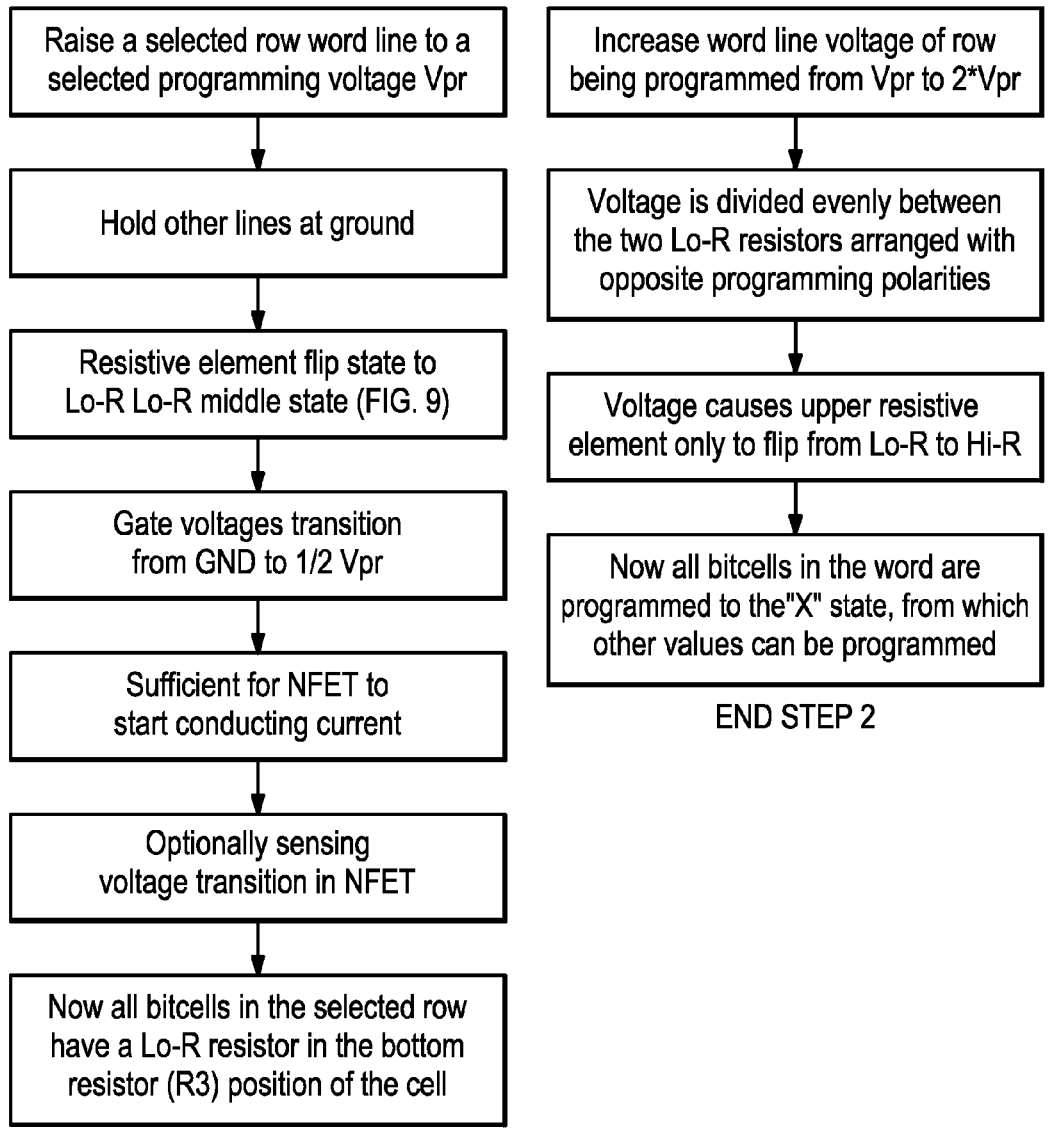
FIG. 14A-14B is a simplified flow diagram of a method for programming a TCAM array consistent with the present disclosure.
Figure 14B:
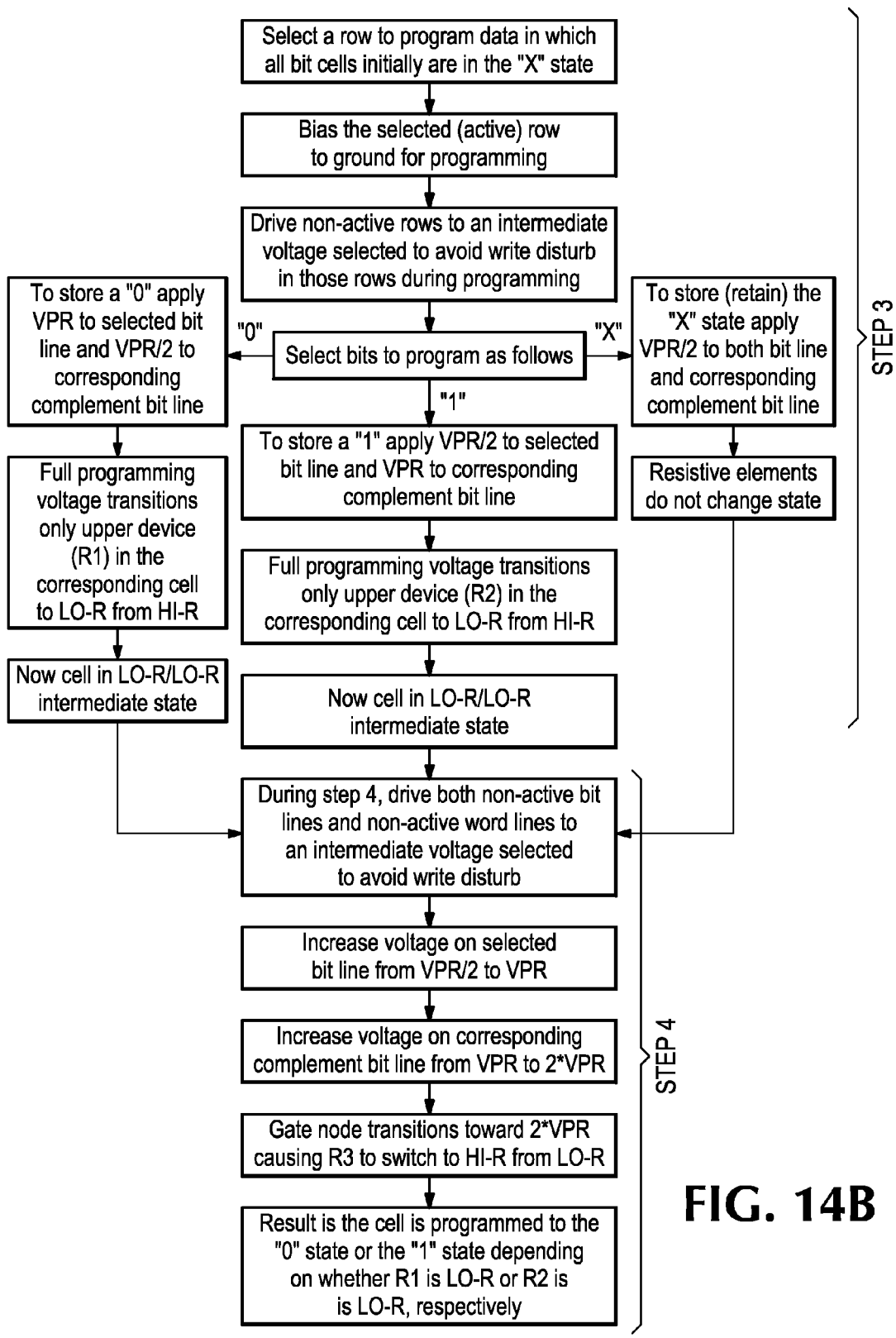

FIGS. 14A-14B present a simplified flow diagram of one embodiment of a method for programming a TCAM array. FIG. 14A on the left side summarizes step #1 of a programming method. This diagram may be read with reference to the circuit example of FIG. 10 by way of illustration and not limitation. The text in the drawing is self-explanatory in view of the discussion above. FIG. 14A on the right side summarizes step #2 of the programming method, in which all of the bit cells in the selected row are programmed to the "X" state. This diagram may be read with reference to the circuit example of FIG. 11 by way of illustration and not limitation. FIG. 14B summarizes steps #3-#4 of the programming method started in FIG. 14A. This diagram may be read with reference to the circuit example of FIGS. 11-12 by way of illustration and not limitation. Again, the text in the drawing will be self-explanatory in view of the discussion above.

Digital Logic Applications of cRRAM

Referring now to FIG. 15A, a circuit is shown including a resistive memory element or cell 1500, in this embodiment comprising a pair of resistive elements 1502, 1504 arranged in anti-serial, bi-stable configuration. In other words, the resistive elements together form a complementary RRAM (cRRAM) switch 1505. The resistive elements may be programmed to a desired state, for example, as discussed above with regard to FIG. 9. When the middle or common node 1512 is used as an output, the ON/OFF vs OFF/ON states of the resistive elements can be used as a programmable switch to connect the output to either the top (BL) or bottom (/BL) lines, as follows.

The resistive elements may be disposed between a bit line BL and its complement bit line /BL. The cell 1500 further includes a switching device, preferably a transistor 1510, which may be a MOSFET in a preferred embodiment. We will refer to the switching device as a transistor for simplicity, without implying a limitation. The transistor 1510 has a control terminal, for example, a gate terminal 1512, coupled to the common node between the resistive elements 1502, 1504. Accordingly, the control terminal, and thus the operation of the transistor, is driven responsive to the state of the cRRAM switch 1505. We will also use the reference 1512 to refer to the common node, also sometimes called the gate node.

The memory cell 1500 is deployed in the circuit of FIG. 15A to form a logic gate, and more specifically a "level shifted" logic gate, in which the memory cell provides the input data to the logic. cRRAM controlled logic of this type can be implemented, in the light of this disclosure, in a wide variety of logic applications, as further explained below. A first non-control terminal 1520 of transistor 1510 is coupled to an output node labeled /Q which serves as an output node of the logic gate. A second non-control terminal 1530 of transistor 1510 is coupled to VSS or ground. Node 1530 may be coupled to ground via a switching device, for example, a transistor 1540, further described shortly.

In an embodiment, a pre-charge device, for example a pre-charge transistor 1550, is arranged to couple output node /Q to a supply voltage. The supply voltage may be VCC or VDD in a CMOS compatible configuration. Preferably, transistor 1550 comprises a PMOS transistor arranged to pull up the /Q output toward VDD during a pre-charge operation. Referring now to FIG. 15B, a simplified timing diagram shows a clock signal (ø) that is asserted low during a pre-charge period 1580. The pre-charge clock signal (ø) is applied to the gate of PMOS device 1550 to turn on the device during the pre-charge period. A footer transistor 1540 may be provided to couple node 1530 to VSS or ground. The transistor 1540 preferably comprises an NMOS transistor. In an embodiment, the pre-charge clock signal (ø) is applied to the gate of NMOS device 1540 to turn off the device during the pre-charge period. In this way, the /Q output is pulled up substantially to VDD during the pre-charge period.

Following the pre-charge period, the /Q output assumes a logic state responsive to the datum stored in the memory cell. Thus it may remain at the pre-charge level, or pull down toward ground if transistor 1510 is on, as transistor 1540 is normally on. This configuration thus provides a level-shifted output voltage swing as compared to the memory cell 1500 alone. In some embodiments the footer transistor 1540 may be omitted.

FIG. 16A shows an example of a logic circuit 1600. In this example, a cRRAM memory cell 1610 may be similar to cell 1500 of FIG. 15A. A second memory cell 1620 ("cR") may be similarly constructed; details are omitted to avoid obscuring the drawing. A pre-charge device, for example a pre-charge transistor 1612, may comprise a PMOS transistor. The pre-charge transistor 1612 is arranged to pull the /Q output node of circuit 1600 up toward a pre-charge voltage level, which may be a supply voltage, during a clocked pre-charge period, as illustrated in FIG. 16B. Further, a footer transistor 1614 may be provided to couple a node 1618 to VSS or ground. The transistor 1614 preferably comprises an NMOS transistor.

One or more logic elements may be arranged in the circuit 1600 between the output node /Q and a common node 1618. The common node 1618 may be coupled to ground via the footer transistor 1614. For example, a first logic element may comprise the memory cell 1620 and a first switching device such as transistor 1622, arranged in series with memory cell 1620. A logic input I$_2$ is arranged to control transistor 1622. A second logic element may comprise a second switching device, for example transistor 1630, which is arranged in parallel with the first logic element. Transistor 1630 is controlled responsive to another logic input I$_1$. Additional logic elements may deployed in parallel to, or in series with, the first and second logic elements.

Referring now to FIG. 16B, a simplified timing diagram shows a clock signal (ø) that is asserted low during a pre-charge period. The pre-charge clock signal (ø) may be applied to the gate of PMOS device 1612 (FIG. 16A) to turn on the device during the pre-charge period. The footer transistor 1614 preferably comprises an NMOS transistor. In an embodiment, the pre-charge clock signal (ø) is applied to the gate of NMOS device 1614 to turn off the device during the pre-charge period. In this way, the /Q output is pulled up substantially to VDD during the pre-charge period. Following the pre-charge period, the /Q output assumes a logic state responsive to the arrangement and values of zero or more logic inputs (I1, I2, . . . ) combined with zero or more stored data inputs (cR1, cR2, . . . ). Additional inputs, including logic inputs I$_n$ or memory elements cR$_n$, may be added in series with one of the mentioned logic elements, or in parallel with the illustrated logic elements, to implement any desired logical function of the data stored in the memory cells combined with the logic input signals.

Figure 17A:
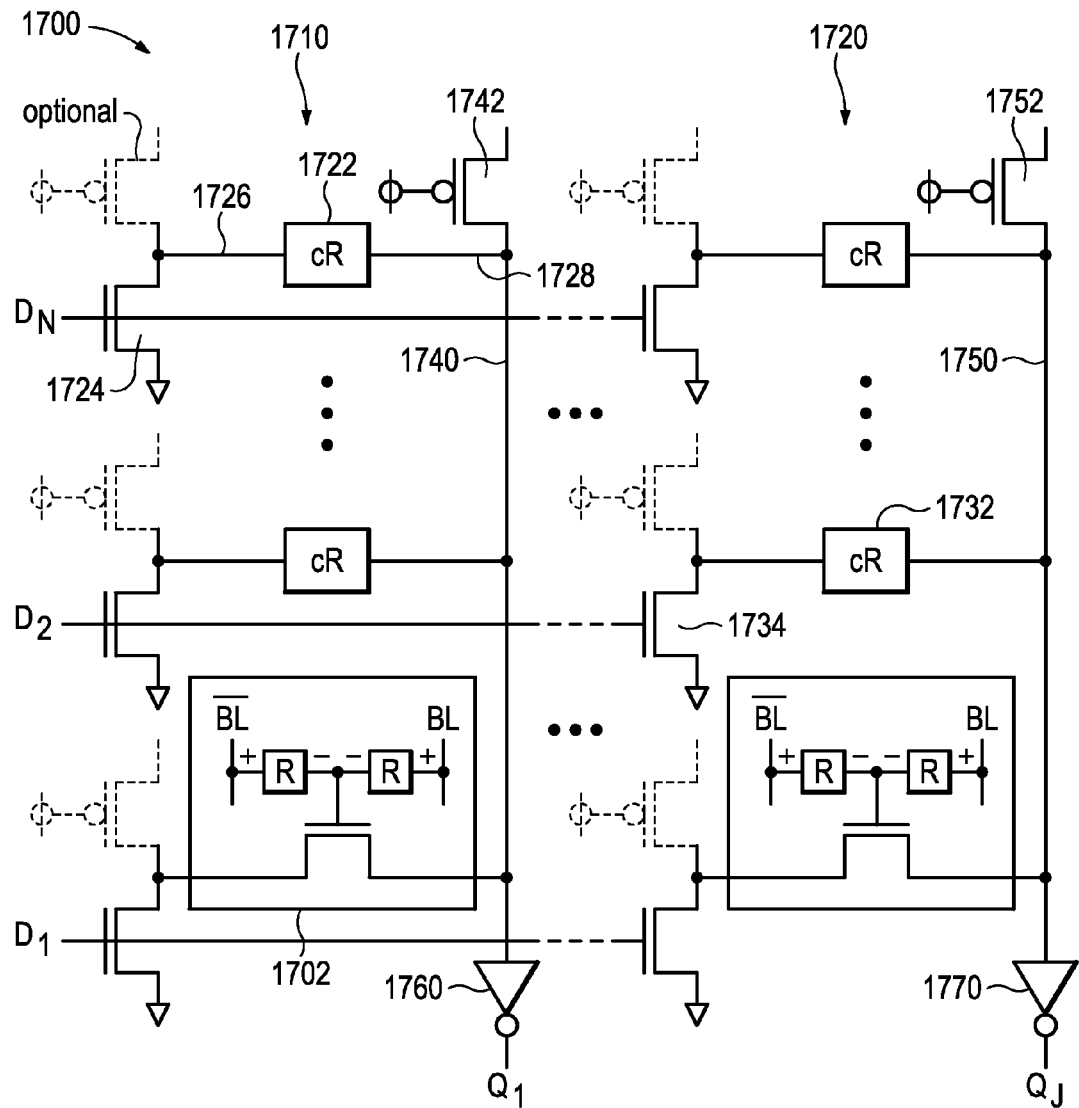
FIG. 17A shows an example of a dynamic logic circuit consistent with the present disclosure arranged to implement a crossbar routing switch.

FIG. 17A is a simplified schematic diagram illustrating an example of a routing switch 1700 utilizing cRRAM memory cells ("cR") for "programming" the switch. Each memory cell comprises a pair of memory elements and a corresponding switching device that is controlled by the state of the memory elements, as shown at cR 1702. The switching device may be a transistor. Preferably, the switching device may be an NMOS device. In an embodiment, the pair of resistive elements may be arranged and programmed as described above with regard to FIG. 9.

In an embodiment, a plurality of memory cells ("cR") may be arranged into columns (1710 . . . 1720) to form a rectangular switch array, shown as N data inputs or rows and J data outputs or columns in the illustrated example. For each memory cell cR in the array, there is a corresponding routing device; for example, cR 1722 has a corresponding routing device 1724 coupled to an input node 1726 of the cR. The cR may be symmetrical so that input node 1726 and output node 1728 are interchangeable (with due regard to orientation of the corresponding resistive elements). The routing device 1724 may be a transistor. Preferably, the routing device may be an NMOS device. Each of the routing devices includes a control terminal, for example, a gate terminal. The gate terminals of the routing transistors of each row of cells are coupled to a corresponding data input (D$_m$) of the row, and arranged so that, in operation, all of the routing devices in the row are controlled responsive to the corresponding data input signal.

Each routing transistor further is coupled between the input node of the corresponding cR and ground. In some embodiments, the input node of the cR may also be coupled to VCC or VDD through a corresponding pre-charge transistor, shown in dashed lines. The corresponding pre-charge transistor is labeled "optional" in the case of cR 1722 for example. On the output side, each cR has an output node, for example output node 1728 in the case of cR 1722. All of the cR output nodes in a single column (1710 . . . 1720) are coupled to a corresponding complement data output node (1740 . . . 1750). Each complement output node may be coupled to a corresponding pre-charge device (1742 . . . 1752). The pre-charge devices may be transistors. Preferably, the pre-charge devices may be PMOS devices. For each row, a corresponding inverter (1760 . . . 1770) may be coupled to the corresponding complement output node to form a corresponding true output signal, indicated as Q1 . . . Qj in FIG. 17A.

Figure 17B:
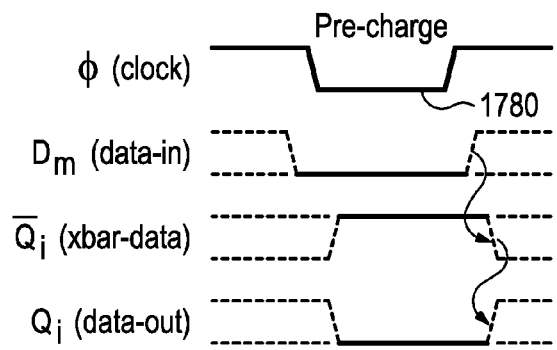
FIG. 17B is a timing diagram illustrating operation in the circuit of FIG. 17A.

Referring now to FIG. 17B, it shows a simplified timing diagram including a pre-charge clock signal (ø) that is asserted low during a selected pre-charge period 1780. The pre-charge clock signal (ø) may be applied to the control terminals or gates of the pre-charge devices 1742 . . . 1752 of each column of the array. When the pre-charge clock signal goes low, the pre-charge devices are turned on, pulling the corresponding nodes Q$_i$-BAR up toward a selected pre-charge voltage. The pre-charge voltage may be VCC. The pre-charge clock signal (ø) may also be applied to the control terminals or gates of the optional pre-charge devices when they are present. The data input lines D$_m$ are pulled low during the pre-charge period. As shown in the timing diagram, at the conclusion of the pre-charge period 1780 the pre-charge clock signal goes high and thus the pre-charge devices are turned off. The data input signals D$_m$ transition to their respective input states, which in turn drive the output signals Q (inverted and true) so that the illustrative circuit implements an N-input×J-output crossbar dynamic logic routing switch using cRRAM elements to select the input-to-output mapping.

It will be obvious to those having skill in the art that many changes may be made to the details of the above-described embodiments without departing from the underlying principles of the invention. The scope of the present invention should, therefore, be determined only by the following claims.

What is claimed is:

1. A ternary content addressable memory (TCAM) cell comprising:
   a first resistive memory element, having a first pair of terminals which are coupled to a true data bit line node and a common node, respectively;
   a second resistive memory element having a second pair of terminals which are coupled to a complement data bit line node and the common node, respectively;
   a third resistive element having a third pair of terminals which are coupled to the common node and a word line node, respectively; and
   a first switching element comprising a control terminal coupled to the common node.

2. The TCAM cell according to claim 1 wherein the first switching element comprises a transistor.

3. The TCAM cell according to claim 1 wherein the first switching element comprises a FET transistor, and the control terminal comprises a gate terminal of the FET transistor.

4. The TCAM cell according to claim 1 wherein the first switching element further comprises first and second non-control terminals; and
   one of the first and second non-control terminals is arranged to provide a match node to sense a match voltage during a match operation.

5. The TCAM cell according to claim 1 wherein:
   the first switching element further comprises first and second non-control terminals; and
   one of the first and second non-control terminals is arranged to provide a read node to sense a read voltage during a verify operation.

6. A ternary content addressable memory (TCAM) array comprising:
   a row of at least two TCAM memory cells, wherein a first TCAM memory cell of the at least two TCAM memory cells comprises:
      a first resistive memory element, having a first pair of terminals which are coupled to a true data bit line node and a common node, respectively;
      a second resistive memory element having a second pair of terminals which are coupled to a complement data bit line node and the common node, respectively;
      a third resistive element having a third pair of terminals which are coupled to the common node and a word line node, respectively; and
      a first switching element comprising a control terminal coupled to the common node;
   wherein:
      the word line node is coupled to a common word line;
      the first switching element has a first non-control terminal implementing a match node for the first TCAM memory cell; and
      the match node of the first TCAM memory cell is coupled to a first row match line.

7. The TCAM array according to claim 6 wherein the true data bit line node is coupled to a corresponding true data bit line of the array and the complement data bit line node is coupled to a corresponding complement data bit line of the array.

8. The TCAM array according to claim 7 and further comprising:
   a second row of TCAM memory cells, wherein
   a true data bit line node of a second TCAM memory cell of the second row is coupled to a true data bit lines of the array;
   a complement data bit line node of the second TCAM memory cell of the second row is coupled to a complement data bit line of the array; and
   a match node of the second TCAM memory cell is coupled to a second row match line.

9. The TCAM array according to claim 7 and further comprising:
   a conductive path serially connecting the first switching element to a second switching element of a second TCAM memory cell of the row so as to form a serial match string;
   wherein the at least two TCAM memory cells are arranged so that the first switching element is turned ON in the case of a match, and turned OFF in the case of a mismatch and the second switching element is turned ON in the case of a match, and turned OFF in the case of a mismatch; and
   wherein current flows in the serial match string in the case of a match for the first switching element and the second switching element.

10. The TCAM array according to claim 9 wherein the first switching element comprises a FET transistor, and the control terminal comprises a gate terminal of the FET transistor.

11. The TCAM array according to claim 9 wherein the first TCAM memory cell is programmable to a "don't care" state by programming the third resistive element to a low resistance (Lo-R) state and programming the first resistive memory element and the second resistive memory element to a high resistance (Hi-R) state.

12. The TCAM array according to claim 9 further comprising a conductive path to connect the first switching element to a second switching element of a second TCAM memory cell to apply a serial match string for verify operations.

* * * * *